US009620890B1

(12) United States Patent
Vino, IV et al.

(10) Patent No.: US 9,620,890 B1
(45) Date of Patent: Apr. 11, 2017

(54) THERMAL-TRANSFER ASSEMBLY AND ELECTRICAL CONNECTOR HAVING THE SAME

(71) Applicant: TYCO ELECTRONICS CORPORATION, Berwyn, PA (US)

(72) Inventors: Michael Joseph Vino, IV, Landisville, PA (US); Alan Weir Bucher, Manheim, PA (US); Craig Warren Hornung, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/164,033

(22) Filed: May 25, 2016

(51) Int. Cl.
| | |
|---|---|
| *H01R 13/00* | (2006.01) |
| *H01R 13/533* | (2006.01) |
| *F28F 13/00* | (2006.01) |
| *H05K 7/20* | (2006.01) |
| *G02B 6/42* | (2006.01) |
| *H01L 21/48* | (2006.01) |
| *H01L 23/367* | (2006.01) |

(52) U.S. Cl.
CPC ........... *H01R 13/533* (2013.01); *F28F 13/00* (2013.01); *H05K 7/20445* (2013.01); *G02B 6/4269* (2013.01); *H01L 21/4882* (2013.01); *H01L 23/367* (2013.01); *H05K 7/20436* (2013.01); *H05K 7/20472* (2013.01)

(58) Field of Classification Search
CPC ........... H05K 7/20436; H05K 7/20472; G02B 6/4269; H01L 21/4882; H01L 23/367
See application file for complete search history.

(56) References Cited

U.S. PATENT DOCUMENTS

| 5,838,065 A | 11/1998 | Hamburgen et al. |
|---|---|---|
| 6,009,938 A | 1/2000 | Smith et al. |
| 6,382,502 B1 * | 5/2002 | Fukui .................. B23K 1/0008 |
| | | 228/120 |
| 6,396,693 B1 | 5/2002 | Shih |
| 6,604,575 B1 | 8/2003 | Degtiarenko |
| 7,489,513 B2 | 2/2009 | Lai et al. |
| 9,343,851 B2 | 5/2016 | Bucher et al. |
| 2008/0101028 A1 * | 5/2008 | Sung ..................... B21D 53/04 |
| | | 361/709 |
| 2009/0284920 A1 * | 11/2009 | Deng .................. H01L 21/4882 |
| | | 361/697 |

(Continued)

*Primary Examiner* — Tho D Ta

(57) ABSTRACT

Thermal-transfer assembly includes a first transfer module having a plurality of first projections. The first projections are spaced apart from one another to form corresponding gaps therebetween. The thermal-transfer assembly also includes a second transfer module having a plurality of second projections. The second projections are spaced apart from one another to form corresponding gaps therebetween. The first and second transfer modules interface with each other in a mated arrangement. The first and second projections project in opposite directions along a Z-axis and intimately engage one another to transfer thermal energy therebetween. The thermal-transfer assembly also includes an assembly clip coupled to and configured to engage each of the first and second transfer modules. The assembly clip prevents the first and second transfer modules from separating along the Z-axis and/or biases the first and second transfer modules away from each other along the Z-axis.

20 Claims, 10 Drawing Sheets

(56) References Cited

U.S. PATENT DOCUMENTS

| | | | |
|---|---|---|---|
| 2011/0297356 A1* | 12/2011 | Hsieh | F28D 15/0233 165/104.26 |
| 2013/0180697 A1* | 7/2013 | Chen | H01L 23/473 165/185 |
| 2014/0286613 A1 | 9/2014 | Ito et al. | |
| 2015/0043168 A1 | 2/2015 | Douglas et al. | |

* cited by examiner

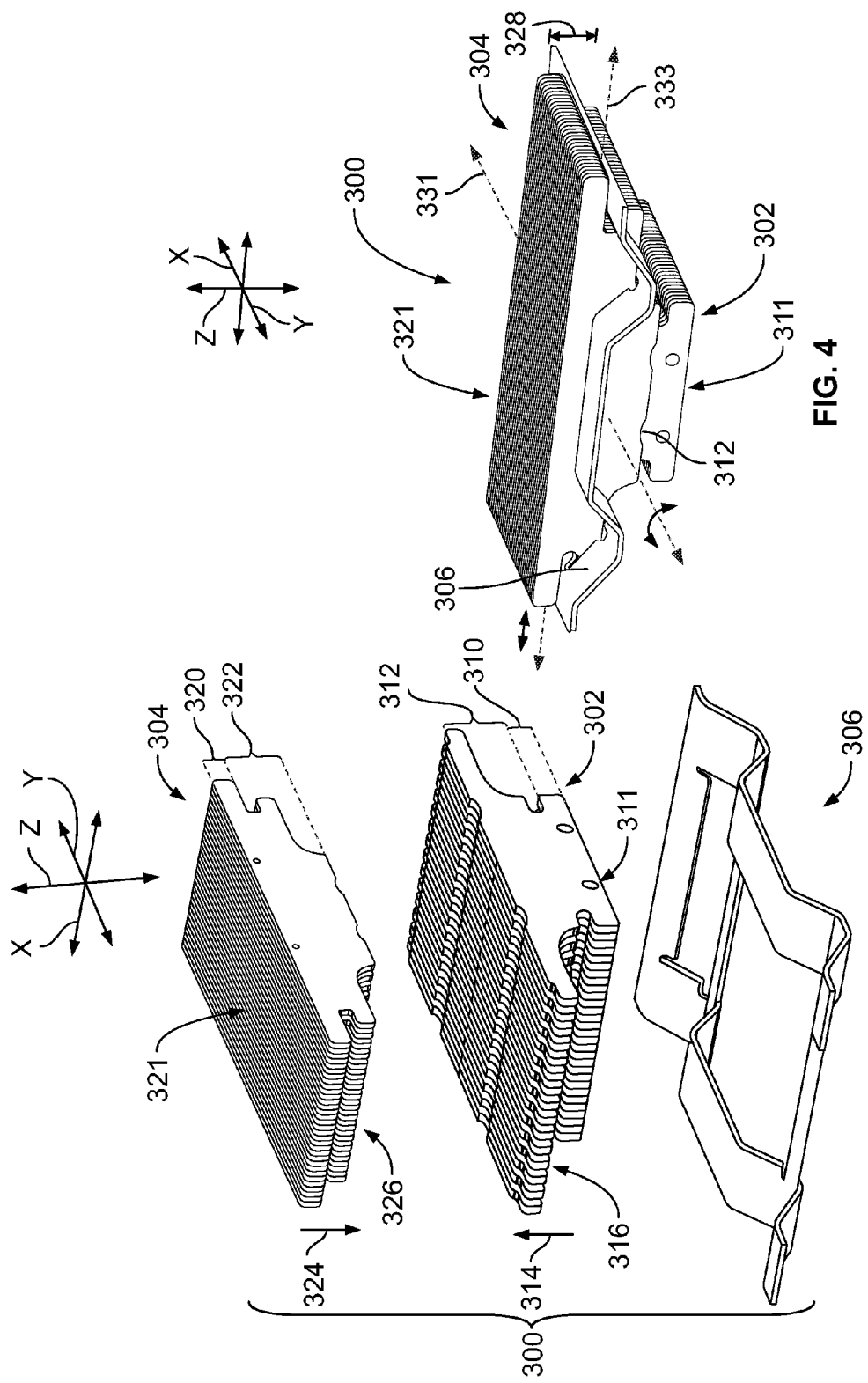

THERMAL-TRANSFER ASSEMBLY AND ELECTRICAL CONNECTOR HAVING THE SAME

BACKGROUND

The subject matter herein relates generally to thermal-transfer assemblies, such as those used to transfer thermal energy away from designated components of an electrical connector for dissipation into the surrounding environment.

It may be desirable to transfer thermal energy (or heat) away from designated components of a system or device. For example, electrical connectors may be used to transmit data and/or electrical power to and from different systems or devices. One type of electrical connector, a cable assembly (or plug assembly), typically includes two or more pluggable connectors that are interconnected through one or more communication cables. Data signals may be transmitted through the communication cable(s) in the form of optical signals and/or electrical signals. Electrical power may also be transmitted through the communication cable (s). Each pluggable connector includes a connector housing having a leading end that is mated with a receptacle assembly and a back end that is coupled to the corresponding communication cable. For some types of pluggable connectors, the pluggable connector includes a circuit board within the connector housing. The circuit board has contact pads that are exposed at the leading end of the connector housing. During a mating operation, the leading end is inserted into a cavity of the receptacle assembly and advanced in a mating direction until the contact pads of the circuit board engage corresponding contacts of a mating connector of the receptacle assembly.

A common challenge that confronts developers of electrical systems is heat management. Thermal energy generated by internal electronics within a system can degrade performance or even damage components of the system. For example, pluggable connectors may include an electro-optical (E/O) engine that is coupled to an interior circuit board of the pluggable connector. The E/O engine transforms data signals from an electrical form to an optical form or vice versa. This transformation process can generate a substantial amount of heat within the pluggable connector.

To dissipate the thermal energy, systems include a thermal bridge that engages the heat source, absorbs the thermal energy from the heat source, and transfers the thermal energy away. The thermal bridge, however, can cause damage. For example, the above pluggable connector may include a thermal pad that engages the thermal bridge. To ensure sufficient heat transfer, the pluggable connector is configured such that the thermal pad is compressed between the connector housing and the thermal bridge. As such, the thermal bridge exerts a normal force against the E/O engine. This normal force, however, increases the likelihood of damage to the E/O engine, the interior circuit board, or both.

Accordingly, there is a need for a thermal-transfer assembly that transfers thermal energy away from a component, such as the internal electronics of an electrical connector, while reducing a likelihood of damage to the component.

BRIEF DESCRIPTION

In an embodiment, a thermal-transfer assembly is provided that includes a first transfer module having a plurality of first projections. The first projections are spaced apart from one another to form corresponding gaps therebetween. The thermal-transfer assembly also includes a second transfer module having a plurality of second projections. The second projections are spaced apart from one another to form corresponding gaps therebetween. The first and second transfer modules interface with each other in a mated arrangement in which the first projections are positioned in the corresponding gaps formed by the second projections and the second projections are positioned in the corresponding gaps formed by the first projections. The first and second projections project in opposite directions along a Z-axis and intimately engage one another to transfer thermal energy therebetween. The thermal-transfer assembly also includes an assembly clip coupled to and configured to engage each of the first and second transfer modules. The assembly clip at least one of prevents the first and second transfer modules from separating along the Z-axis or biases the first and second transfer modules away from each other along the Z-axis.

In an embodiment, an electrical connector is provided that includes a connector housing having an interior cavity defined by an inner surface of the connector housing. The connector housing defines an exterior of the electrical connector. The electrical connector also includes internal electronics disposed within the interior cavity. The internal electronics are configured to generate thermal energy during operation. The electrical connector also includes a thermal-transfer assembly that forms at least a portion of a thermal-transfer path from the internal electronics to the exterior of the electrical connector. The thermal-transfer assembly includes a first transfer module having a plurality of first projections. The first projections are spaced apart from one another to form corresponding gaps therebetween. The thermal-transfer assembly also includes a second transfer module having a plurality of second projections. The second projections are spaced apart from one another to form corresponding gaps therebetween. The first and second transfer modules interface with each other in a mated arrangement in which the first projections are positioned in the corresponding gaps formed by the second projections and the second projections are positioned in the corresponding gaps formed by the first projections. The first and second projections project in opposite directions along a Z-axis and intimately engage one another to transfer thermal energy therebetween. The thermal-transfer assembly also includes an assembly clip coupled to each of the first and second transfer modules. The assembly clip biases the first and second transfer modules away from each other along the Z-axis.

In an embodiment, a thermal-transfer module is provided that includes a plurality of sheet sections stacked side-by-side to form a body base and a plurality of projections that extend away from the body base and are spaced apart from one another to form gaps therebetween. The sheet sections include spacer sections and transfer sections. The spacer sections and transfer sections are interleaved with one another. The transfer sections are sized and shaped relative to the spacer sections to form the projections. The spacer sections are positioned between adjacent transfer sections to define the corresponding gaps between adjacent projections.

BRIEF DESCRIPTION OF THE DRAWINGS

FIG. 3 is an exploded view of a thermal-transfer assembly in accordance with an embodiment that may be used with the electrical connector of FIG. 2. The thermal-transfer assembly includes first and second thermal-transfer modules.

FIG. 4 is a perspective view of the thermal-transfer assembly of FIG. 3 when assembled for operation.

DETAILED DESCRIPTION

Embodiments set forth herein include thermal-transfer modules, thermal-transfer assemblies having such thermal-transfer modules, and systems (e.g., electrical connectors) that include thermal-transfer assemblies. For simplicity, the thermal-transfer modules may be referred to as "transfer modules." Thermal-transfer assemblies include two or more transfer modules that interface with one another to transfer thermal energy therebetween. Although embodiments described below are with reference to particular types of electrical connectors, it should be understood that thermal-transfer assemblies may be used to transfer thermal energy away from any type of component to a surrounding environment. For example, thermal-transfer assemblies may be mounted over a processor of a land grid array (LGA) assembly.

Figure 1:
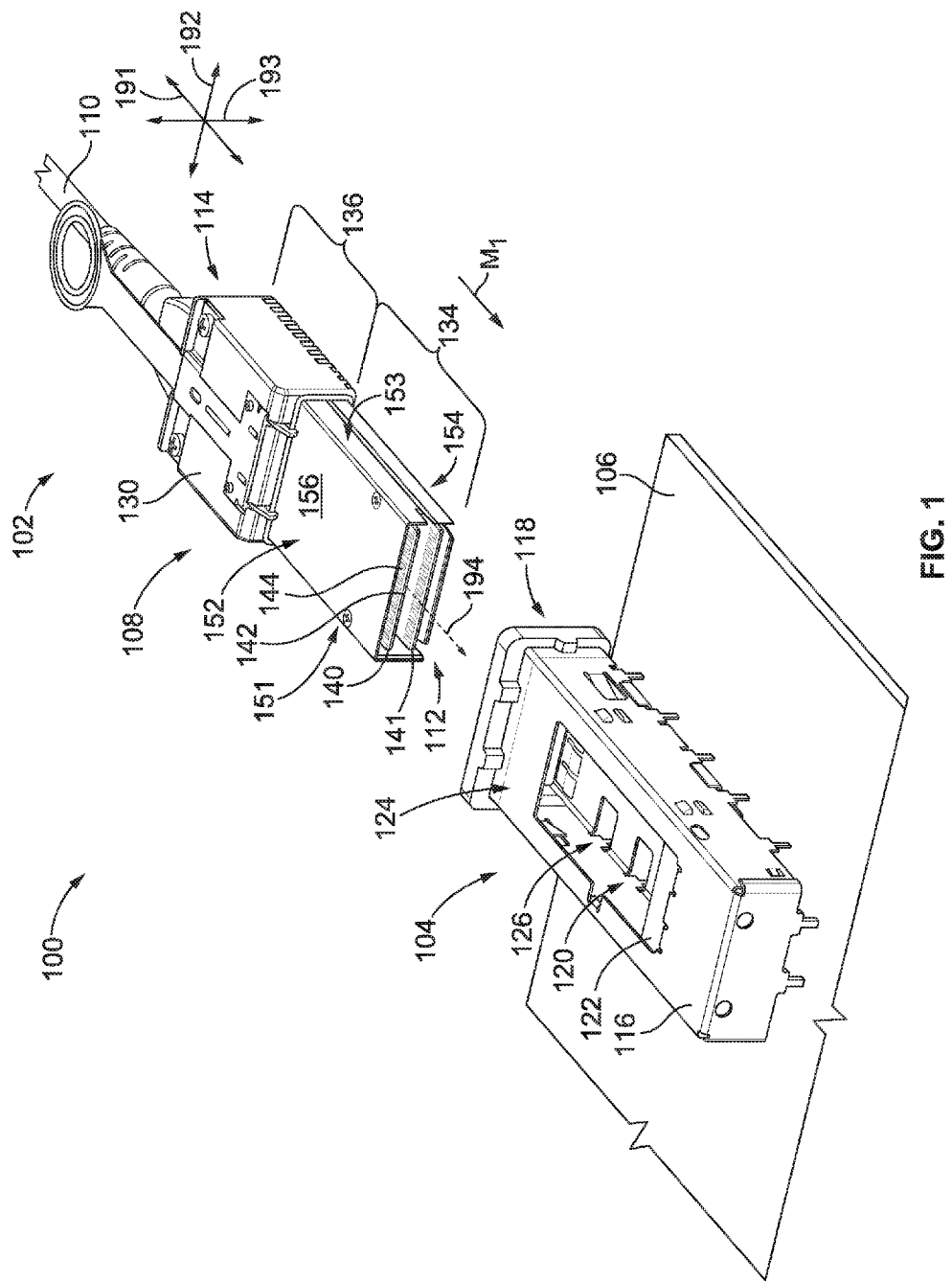
FIG. 1 is a perspective view of a plug and receptacle assembly formed in accordance with an embodiment.

FIG. 1 is a perspective view of a plug and receptacle assembly 100 formed in accordance with an embodiment that includes a plug assembly 102 and a receptacle assembly 104. The plug and receptacle assembly 100 may also be referred to as a communication system, and the plug assembly 102 may also be referred to as a cable assembly. The receptacle assembly 104 is mounted to a circuit board 106. The circuit board 106 may be, for example, a daughter card or a mother board. In the illustrated embodiment, the plug assembly 102 includes a pluggable connector 108 that is an input/output (I/O) module capable of repeatedly engaging the receptacle assembly 104. In FIG. 1, the plug and receptacle assembly 100 is oriented with respect to mutually perpendicular axes, including a mating axis 191, a lateral axis 192, and an elevation axis 193. Although the elevation axis 193 appears to extend parallel to the force of gravity in FIG. 1 with gravity pulling the receptacle assembly 104 toward the circuit board 106, it is understood that the plug and receptacle assembly 100 and its components may have other spatial orientations. For example, the lateral axis 192 may extend parallel to the force of gravity.

The plug assembly 102 includes a communication cable 110 that is coupled to a trailing end 114 of the pluggable connector 108. Although not shown, the plug assembly 102 may include another pluggable connector 108 that is attached to an opposite end of the communication cable 110. The pluggable connector 108 has a leading end 112 that is opposite the trailing end 114. A central axis 194 of the pluggable connector 108 extends between the leading end 112 and the trailing end 114.

The receptacle assembly 104 has a receptacle housing 116. In some embodiments, the receptacle housing 116 may be stamped and formed from sheet metal to form a receptacle cage. In other embodiments, the receptacle housing 116 may be formed from other manufacturing methods. The receptacle housing 116 defines a communication port 118 that provides access to a housing cavity 120 within the receptacle housing 116. The communication port 118 and the housing cavity 120 are configured to receive a portion of the pluggable connector 108. For example, the leading end 112 of the pluggable connector 108 is configured to be inserted through the communication port 118 and into the housing cavity 120.

To insert the leading end 112 into the housing cavity 120, the pluggable connector 108 is aligned with respect to the communication port 118 and the housing cavity 120 and advanced through the communication port 118 in a mating direction $M_1$. The mating direction $M_1$ is parallel to the mating axis 191. The leading end 112 is advanced toward a mating connector 122 that is disposed within the housing cavity 120. The pluggable connector 108 and the mating connector 122 form a pluggable engagement.

Optionally, the receptacle assembly 104 includes an external thermal-transfer module (not shown) that is configured to engage the pluggable connector 108 when the pluggable connector 108 is mated with the receptacle assembly 104 and disposed within the housing cavity 120. The external thermal-transfer module may be similar to internal thermal-transfer modules 302, 304 (shown in FIG. 3) or another type of thermal-transfer module.

The receptacle housing 116 has a top side 124 that includes an opening 126 therethrough. In some embodiments, the external thermal-transfer module may be mounted to the top side 124 and extend along the opening 126. The external thermal-transfer module may have a surface (not shown) that engages the pluggable connector 108 when the pluggable connector 108 is positioned within the housing cavity 120. As such, the external thermal-transfer module may absorb thermal energy generated by the pluggable connector 108.

The communication cable 110 is configured to transmit data signals therethrough and, optionally, electrical power. In alternative embodiments, the communication cable 110 may only transmit electrical power. In an exemplary embodiment, the communication cable 110 includes optical fibers that are configured to transmit data signals in the form of optical signals. The optical fibers may be communicatively coupled to internal electronics 128 (shown in FIG. 2) of the pluggable connector 108, such as an electro-optical (E/O) engine, integrated circuits, processing units, or other circuitry. In other embodiments, the communication cable 110 includes insulated wires having jackets that surround wire conductors. The wire conductors may be configured to transmit electrical signals and/or electrical power.

In particular embodiments, the plug and receptacle assembly 100 is a high speed pluggable input/output (I/O) interconnect assembly. The plug and receptacle assembly 100, the plug assembly 102, and/or the pluggable connector 108 may be configured for various applications. Non-limiting examples of such applications include storage networking, cluster computing, high performance computing, and telecommunications. The plug and receptacle assembly 100, the plug assembly 102, and/or the pluggable connector 108 may be used with switches, hubs, storage systems, storage devices, adapters, controllers, network interface cards (NICs), servers, switches, host bus adapters (HBAs), and routers. By way of one example, the pluggable connector 108 and/or the receptacle assembly 104 may be part of a quad small form-factor pluggable (QSFP) interconnect system, such as the QSFP+ system available from TE Connectivity. As another example, the pluggable connector 108 and/or the receptacle assembly 104 may be part of a CDFP interconnect system, which is a standard developed through a multi-source agreement. The plug and receptacle assembly 100 may be capable of achieving high data rates, such as data rates that exceed 20 gigabits per second (Gbps), 50 Gbps, 100 Gbps, or more. The plug and receptacle assembly 100 may also be configured to satisfy various industry standards, such as Ethernet, Fibre Channel, and InfiniBand.

In other embodiments, the plug and receptacle assembly 100 may transmit data at slower speeds. Yet in other embodiments, the pluggable connector 108 may not transit data signals. Instead, the pluggable connector 108 may only transmit electrical power.

The pluggable connector 108 has a connector housing 130 that includes the leading end 112 and the trailing end 114. The connector housing 130 forms an interior cavity 132 (shown in FIG. 2) where the internal electronics 128 (FIG. 2) are located. The interior cavity 132 extends between the leading end 112 and the trailing end 114 and may open to the leading end 112. The connector housing 130 has a plug portion 134 that is sized and shaped to be inserted through the communication port 118 and into the housing cavity 120 of the receptacle assembly 104. The connector housing 130 also includes a body portion 136 that is not inserted into the housing cavity 120. The plug portion 134 includes the leading end 112. In an exemplary embodiment, the plug portion 134 includes the internal electronics 128 and a thermal-transfer assembly 160 (shown in FIG. 2) that transfers heat generated by the internal electronics 128 to an exterior surface 156 of the connector housing 130. In other embodiments, the body portion 136 may include the internal electronics 128 and/or the thermal-transfer assembly 160. The body portion 136 includes the trailing end 114 and may be configured to be gripped by an individual.

The pluggable connector 108 includes a pair of circuit boards 140, 141 that each have a board edge 142 with mating terminals 144. In alternative embodiments, the pluggable connector 108 may have only one circuit board or may not include a circuit board. In an exemplary embodiment, the mating terminals 144 are electrical contacts or, more specifically, contact pads. The circuit boards 140, 141 are disposed within the interior cavity 132 (FIG. 2) and exposed at the leading end 112. The mating terminals 144 are configured to engage corresponding terminals (not shown) of the mating connector 122 in the receptacle assembly 104. The mating terminals 144 may be other types of electrical contacts, such as contact beams, in other embodiments The plug portion 134 of the connector housing 130 includes plug sides 151, 152, 153, 154 that extend parallel to the central axis 194 and between the leading and trailing ends 112, 114. The plug sides 151, 153 face in opposite directions along the lateral axis 192 and extend longitudinally along the mating axis 191 between the body portion 136 and the leading end 112. The plug sides 152, 154 face in opposite directions along the elevation axis 193 and extend longitudinally along the mating axis 191 between the body portion 136 and the leading end 112. The plug sides 152, 154 extend laterally between the plug sides 151, 153. When the pluggable connector 108 is mated with the receptacle assembly 104, the thermal-transfer module (not shown) of the receptacle assembly 104 may engage the exterior surface 156 along the plug side 152. As described below, the thermal-transfer assembly 160 (FIG. 2) may thermally couple the exterior surface 156 along the plug side 152 to the internal electronics 128 (FIG. 2).

Figure 2:
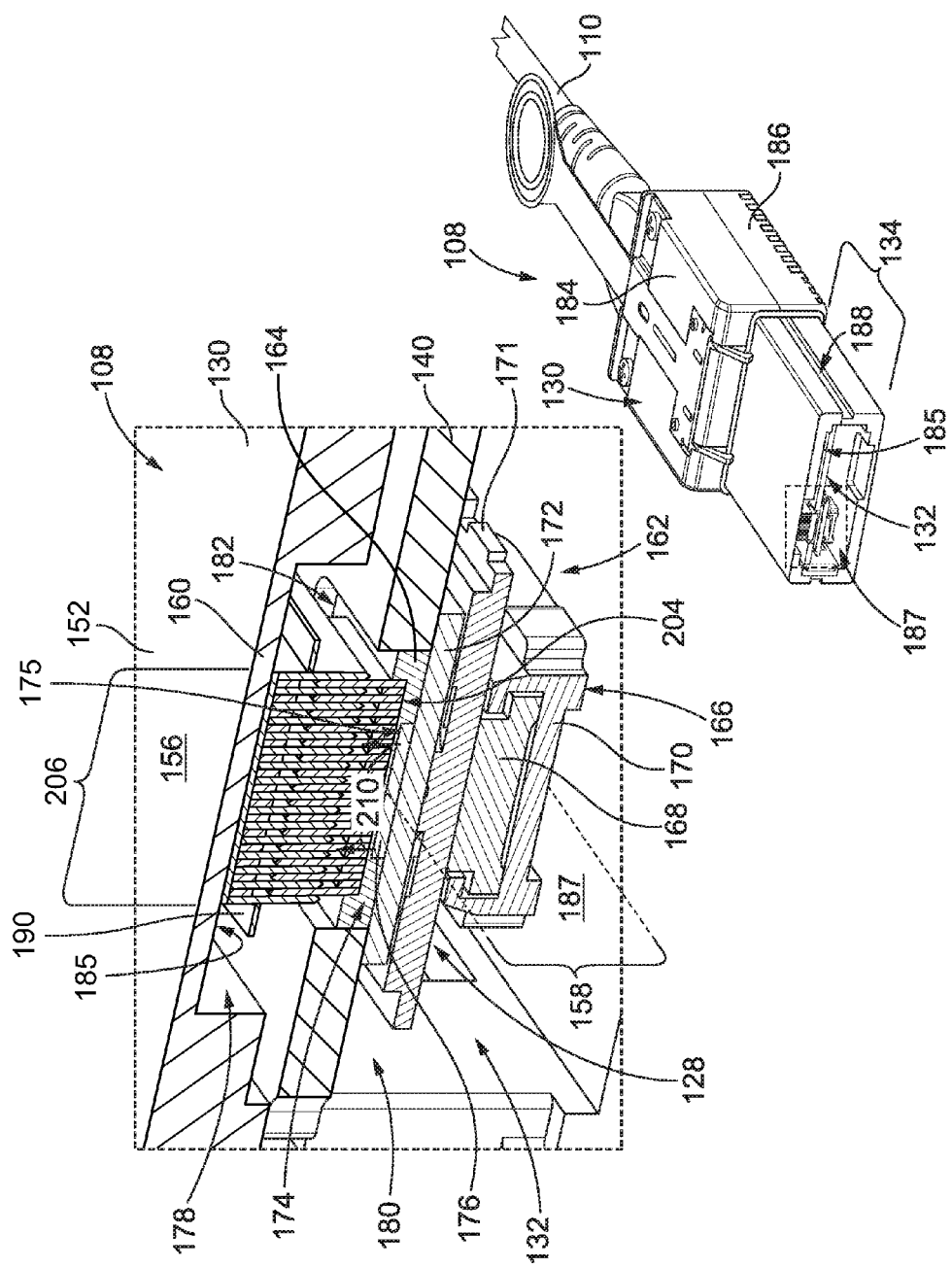
FIG. 2 is a cut-away view of an electrical connector formed in accordance with one embodiment that may be used with the plug and receptacle assembly of FIG. 1.

FIG. 2 includes a perspective cut-away view of the pluggable connector 108 with a section of the plug portion 134 removed to show internal components of the pluggable connector 108. The connector housing 130 may be formed from multiple housing shells. For example, the connector housing 130 is formed from first and second housing shells 184, 186 that are joined together along an interface or seam 188. The interior cavity 132 is defined between the first and second housing shells 184, 186. The first and second housing shells 184, 186 may include respective inner surfaces 185, 187 that at least partially define the interior cavity 132 within the plug portion 134.

FIG. 2 also includes an enlarged view of the pluggable connector 108 that shows the interior cavity 132 in greater detail. The pluggable connector 108 has a communication assembly (or sub-assembly) 162 that is configured to receive data and/or electrical power through the communication cable 110. The communication assembly 162 is disposed within the interior cavity 132. In an exemplary embodiment, the communication assembly 162 includes the circuit board 140, the circuit board 141 (FIG. 1), and the internal electronics 128. For illustrative purposes, the circuit board 141 is not shown in FIG. 2. At least a portion of the communication assembly 162 may be positioned outside of the interior cavity 132 or exposed to an exterior of the pluggable connector 108. For example, the mating terminals 144 (FIG. 1) may be part of the communication assembly 162 and may be exposed to the exterior of the pluggable connector 108 at the leading end 112 (FIG. 1).

The internal electronics 128 may include electrical circuits and/or devices through which current propagates. The internal electronics 128 may generate a substantial amount of heat during operation of the pluggable connector 108. For example, the internal electronics 128 may include lasers and/or circuitry, such as integrated circuits or other circuitry that may process data signals.

In some embodiments, the internal electronics 128 includes an E/O engine 158. The E/O engine 158 is configured to convert data signals between an electrical signal form and an optical signal form. As such, the E/O engine 158 may also be referred to as a signal converter. As shown in FIG. 2, the E/O engine 158 includes an optical connector 166 that is communicatively coupled to optical fibers (not shown) of the communication cable 110. The optical connector 166 includes a light-transmitting device 168 and a device housing 170 that surrounds the light-transmitting device 168. The light-transmitting device 168 may receive optical signals from the optical fibers or receive optical signals from light generators of the E/O engine 158, such as vertical-cavity surface-emitting lasers (VCSELs) (not shown). The light-transmitting device 168 may direct the optical signals to different portions of the E/O engine 158.

The E/O engine 158 also includes a base structure 171, an interconnecting carrier 172, and processing circuitry 174. The base structure 171 and the interconnecting carrier 172 are positioned between the optical connector 166 and the processing circuitry 174. The base structure 171 and the interconnecting carrier 172 may have conductive pathways and/or optical pathways therethrough to operably couple the optical connector 166 and the processing circuitry 174. In an exemplary embodiment, the interconnecting carrier 172 includes glass, but other materials may be used. The processing circuitry 174 may include one or more processing units 176 and an encapsulant 164 that surrounds the processing units 176. Each of the processing units 176 is configured to receive input data signals and process the input data signals in a predetermined manner to provide output data signals. Non-limiting examples of processing units that may be used in the E/O engine 158 may include integrated circuits, laser drivers, amplifiers (such as transimpedance amplifiers (TIAs)), or other electrical circuitry. Although the above describes particular components of the pluggable connector 108, it should be understood that embodiments may include other connectors or devices that generate thermal energy within an interior cavity. These other connectors or devices may have other components positioned within the interior cavity.

As shown in FIG. 2, the circuit board 140 may separate the interior cavity 132 into cavity regions 178, 180. The cavity region 178 is located between the circuit board 140 and the inner surface 185 of the first housing shell 184. The cavity region 180 is located between the circuit board 140 and the inner surface 187 of the second housing shell 186. Although not shown, the circuit board 141 (FIG. 1) may extend through the interior cavity 132 and divide the cavity region 180 into separate cavity regions such that a cavity region exists between the circuit boards 140, 141.

The E/O engine 158 is coupled to the circuit board 140. In the illustrated embodiment, the E/O engine 158 is substantially disposed within the cavity region 180 such that an entirety or almost an entirety of the E/O engine 158 is positioned within the cavity region 180. In other embodiments, however, the E/O engine 158 may be disposed within the cavity region 178 or within both of the cavity regions 178, 180. Also shown, the circuit board 140 may include a board window 182. The E/O engine 158 may be coupled to the circuit board 140 such that the E/O engine 158 extends across and covers at least a portion of the board window 182.

Embodiments set forth herein may include a thermal-transfer assembly disposed within an electrical connector, such as the pluggable connector 108. For example, the pluggable connector 108 includes the thermal-transfer assembly 160 disposed within the interior cavity 132. The thermal-transfer assembly 160 includes a first transfer module 204 and a second transfer module 206. The first and second transfer modules 204, 206 are thermally coupled to each other such that the first and second transfer modules 204, 206 form at least a portion of a thermal-transfer path between the internal electronics 128 and the exterior surface 156.

In the illustrated embodiment, the thermal-transfer path extends from the internal electronics 128 to a portion of the exterior surface 156 along the plug side 152. The first transfer module 204 intimately engages the internal electronics 128 and, more particularly, a source surface 175 of the processing circuitry 174. The source surface 175 may be, for example, a surface of the encapsulant 164 or the processing unit 176. The second transfer module 206 intimately engages the inner surface 185. Thermal energy is transferred through a thermal-transfer path 210 that extends from the internal electronics 128 to the exterior surface 156. For example, in the illustrated embodiment, the thermal energy is conveyed from the internal electronics 128 to the first transfer module 204 and is then conveyed through the first transfer module 204 to the second transfer module 206. The thermal energy is then conveyed through the second transfer module 206 to the inner surface 185 and through the connector housing 130 to the exterior surface 156. The exterior surface 156 of the connector housing 130 permits the thermal energy to dissipate therefrom. For example, as described above, the exterior surface 156 may engage a thermal-transfer module (not shown) of the receptacle assembly 104 (FIG. 1) that absorbs thermal energy from the exterior surface 156. In other embodiments, airflow may be directed along the exterior surface 156.

The processing circuitry 174 is configured to have a predetermined position (or height) within the interior cavity 132 so that the thermal-transfer assembly 160 may form a portion of the thermal-transfer path 210 from the source surface 175 of the processing circuitry 174 to the inner surface 185. In the illustrated embodiment, a number of components are coupled to or stacked with the processing circuitry 174. Each of these components may determine the position of the source surface 175 within the interior cavity 132. For example, the size, shape, and position of the circuit board 140, the size, shape, and position of the interconnecting carrier 172, and/or the size, shape, and position of the processing circuitry 174 may determine where the source surface 175 is positioned within the interior cavity 132. Due to the tolerances in manufacturing these different components, the position of the source surface 175 may vary within the interior cavity 132. The thermal-transfer assembly 160 is configured to accommodate this variation so that the thermal-transfer path 210 may be formed through the thermal-transfer assembly 160 regardless of the position of the source surface 175. The thermal-transfer assembly 160 may also be able to adjust if the components move during the lifetime operation of the pluggable connector 108 such that the position of the source surface 175 changes.

To this end, the first and second transfer modules 204, 206 are movably coupled to each other by an assembly clip 190. As described below, the assembly clip 190 may bias the first and second transfer modules 204, 206 against the respective surfaces, but may permit movement of the first and second transfer modules 204, 206 relative to each other. The first and second transfer modules 204, 206 may comprise a material having a suitable thermal conductivity for transferring heat away from the interior cavity 132 or, more specifically, the internal electronics 128 disposed within the interior cavity 132. The material may be, for example, a metal or polymer with metal fibers. During operation of the pluggable connector 108, thermal energy generated by the internal electronics 128 may be absorbed by the first thermal-transfer module 204 and conveyed to the second thermal-transfer module 206.

Although embodiments described herein are with reference to a pluggable connector, it should be understood that the thermal-transfer assemblies may be used in other applications. For example, the thermal-transfer assemblies may be used in other devices in which the heat source (or other component connected to the heat source) may have a different position within the device due to manufacturing tolerances (or other reasons) and/or may move within the device during lifetime operation of the device.

FIG. 3 is an exploded view of a thermal-transfer assembly 300 in accordance with an embodiment. FIG. 4 is a perspective view of the thermal-transfer assembly 300 when assembled for operation. The thermal-transfer assembly 300 may be disposed within an interior cavity of a device, such as an electrical connector (not shown). For example, the thermal-transfer assembly 300 may replace the thermal-transfer assembly 160 (FIG. 2) in the pluggable connector 108 (FIG. 2) and transfer thermal energy away from the internal electronics 128 (FIG. 2). Other types of electrical connectors may also include the thermal-transfer assembly 300 disposed therein. In alternative embodiments, the thermal-transfer assembly 300 is disposed within or coupled to a different type of device.

The thermal-transfer assembly 300 includes a first transfer module 302, a second transfer module 304, and an assembly clip 306. The thermal-transfer assembly 300 is oriented relative to X-, Y-, and Z-axes that are mutually perpendicular. Although the Z-axis appears to extend parallel to the force of gravity in FIGS. 3 and 4, it should be understood that the thermal-transfer assembly 300 may have any orientation relative to gravity.

As shown in FIG. 3, the first transfer module 302 includes a body base 310 and a plurality of projections 312 that extend away (or project) from the body base 310 in a first direction 314 along the Z-axis. The projections 312 are spaced apart from one another to form corresponding gaps 316 therebetween. The first transfer module 302 has an engagement side 311 along the body base 310 that is configured to intimately engage a surface of another object for transferring thermal energy therebetween. The engagement side 311 generally faces in a second direction 324 along the Z-axis that is opposite the first direction 314.

The second transfer module 304 includes a body base 320 and a plurality of projections 322 that extend away (or project) from the body base 320 in the second direction 324 along the Z-axis. The projections 322 are spaced apart from one another to form corresponding gaps 326 therebetween. The second transfer module 304 has an engagement side 321 along the body base 320 that is configured to intimately engage a surface of another object for transferring thermal energy therebetween. The engagement side 321 generally faces in the first direction 314 along the Z-axis. In the illustrated embodiments, the engagement sides 311, 321 are essentially planar. In other embodiments, however, the engagement sides 311, 321 may have non-planar contours that, for example, complement or match the contours of the surfaces that the engagement sides 311, 321 engage.

In the illustrated embodiment, the projections 312, 322 are shaped as blades or fins that are oriented parallel to a YZ plane. It should be understood, however, that the projections 312, 322 may have a variety of shapes that permit the first and second transfer modules 302, 304 to mate or merge with each other and transfer thermal energy therebetween.

As shown in FIG. 4, the first and second transfer modules 302, 304 are configured to interface with each other in a mated arrangement. In the mated arrangement, the projections 312 are positioned in the corresponding gaps 326 (FIG. 3) formed by the projections 322, and the projections 322 are positioned in the corresponding gaps 316 (FIG. 3) formed by the projections 312. In the mated arrangement, the projections 312, 322 intimately engage one another to transfer thermal energy therebetween. As used herein, the phrase "intimately engage" includes surfaces directly contacting one another and/or having a small tolerance space therebetween that allows the transfer of thermal energy. The tolerance space may be, for example, at most 0.200 millimeters (mm) or 200 microns. In some embodiments, the tolerance space may be less than 0.100 mm or 100 microns. In certain embodiments, the tolerance space may be less than 0.075 mm or 75 microns. In particular embodiments, the tolerance space may be less than 0.050 mm or 50 microns or, more particularly, less than 0.025 mm or 25 microns. In particular embodiments, the tolerance space may be less than 0.010 mm or 10 microns. In particular embodiments, the tolerance space may be less than 0.005 mm or 5 microns.

As described below, the assembly clip 306 is coupled to and is configured to engage each of the first and second transfer modules 302, 304. The assembly clip 306 permits the first and second transfer modules 302, 304 to move relative to one another at least along the Z-axis. More specifically, the assembly clip 306 may prevent the first and second transfer modules 302, 304 from moving in opposite directions along the Z-axis after a designated expansion distance 328. The expansion distance 328 may represent a maximum amount in which the first and second transfer modules 302, 304 may move away from each other along the Z-axis prior to being stopped by the assembly clip 306. The expansion distance 328 may be determined by the difference between a maximum height H1 (shown in FIG. 15) of the thermal-transfer assembly 300 and a minimum height H2 (show in FIG. 17) of the thermal-transfer assembly 300. The expansion distance 328 may be, for example, at most 10 mm, at most 8 mm, or at most 5 mm. In more particular embodiments, the expansion distance 328 may be at most 3 mm or at most 2 mm. In other embodiments, however, the expansion distance 328 may be determined or limited by other components, such as the housing in which the thermal-transfer assembly 300 is inserted. In such embodiments, the assembly clip 306 may not determine or limit the expansion distance 328. For example, surfaces of the housing (e.g., inner surfaces 185, 187 (FIG. 2)) may determine the expansion distance 328.

Alternatively or in addition to the above, the assembly clip 306 may bias the first and second transfer modules 302, 304 away from each other along the Z-axis. In the illustrated embodiment, the assembly clip 306 is configured to both prevent the first and second transfer modules 302, 304 from separating along the Z-axis and bias the first and second transfer modules 302, 304 away from each other along the Z-axis. In other embodiments, however, the assembly clip 306 is configured to either (a) prevent the first and second transfer modules 302, 304 from separating along the Z-axis or (b) bias the first and second transfer modules 302, 304 away from each other along the Z-axis. In some embodiments, the assembly clip 306 may be configured to permit one of the first and second transfer modules 302, 304 to rotate relative to the other transfer module about an axis 331 that is parallel to the X-axis (as indicated by a double-headed arrow) and/or permit one of the first and second transfer modules 302, 304 to shift relative to the other transfer module along an axis 333 that is parallel to the Y-axis (as indicated by a double-headed arrow). The first and second transfer modules 302, 304 may be shaped to permit rotation or other movement.

Although the assembly clip 306 may permit the first and second transfer modules 302, 304 to move relative to one another, it should be understood that other structures may prevent or limit this movement. For example, during assembly of the thermal-transfer assembly 300 and/or a device that includes the thermal-transfer assembly 300, the assembly clip 306 may allow the first and second transfer modules 302, 304 to move relative to one another. For example, the assembly clip 306 may allow the first and second transfer modules 302, 304 to move relative to one another when the first and second transfer modules 302, 304 engage other components of the device.

After the device is fully constructed, however, the first and second transfer modules 302, 304 may have only limited movement. For example, after the device is fully constructed, the first and second transfer modules 302, 304 may be initially held in fixed positions relative to one another by components of the device. At this time, the assembly clip 306 may generate forces that press the first and second transfer modules 302, 304 against respective surfaces. During the lifetime operation of the device, however, the components of the device may warp or bend or may creep relative to one another. As this occurs, the assembly clip 306 may permit or cause the first and second transfer modules 302, 304 to move relative to one another. In such cases, the first and second transfer modules 302, 304 may remain intimately engaged with the respective surfaces. For instance, the engagement sides 311, 321 may remain intimately engaged with the respective surfaces.

Accordingly, for some embodiments, the assembly clip may tolerate some movement of the first and second transfer module relative to one another. For instance, a thermal-transfer assembly may be positioned between an interior component and a housing portion (e.g., housing shell) or other component. The interior component, in turn, may be stacked with respect to other interior components in a larger device (e.g., a pluggable connector). For example, the interior component may be a single converter or E/O converter and other interior components may include a printed circuit board (PCB). When the multiple components are stacked with respect to one another, the stacked components have a combined stack height. Any tolerance errors in the dimensions of the individual components are combined and form a combined tolerance error.

Because this combined tolerance error is a function of a number of components, it may be difficult to accurately predict the combined stack height. In some embodiments, the thermal-transfer module may accommodate a range of stack heights by allowing the first and second transfer modules to move with respect to each other along the Z-axis. Because the transfer modules include transfer sections (described below), such as blades, that are interleaved with one another, a thermal pathway may be maintained even when the first and second transfer modules move away from each other. In particular embodiments, the assembly clip also provides a biasing force against one or both of the transfer modules so that an intimate engagement for heat transfer is maintained.

In the illustrated embodiment, the assembly clip 306 engages each of the first and second transfer modules 302, 304 and generates a respective biasing force against the first and second transfer modules 302, 304. The biasing forces press the first and second transfer modules 302, 304 against respective surfaces to maintain an intimate engagement for heat transfer. In other embodiments, however, the assembly clip may engage and generate a biasing force against only the first transfer module or only the second transfer module. In such embodiments, the assembly clip may engage other components within the interior cavity, such as a portion of the housing that defines the interior cavity.

For example, in an alternative embodiment, the first transfer module may be secured to the heat source within an interior cavity that is partially defined by a first housing shell. The assembly clip may be coupled to the first housing shell. When the second transfer module is merged with the first transfer module, the second transfer module may engage the assembly clip. The second housing shell may then be placed on top of the first housing shell. As the second housing shell engages the second transfer module, the assembly clip generates a biasing force against the second transfer module (and not the first transfer module) so that the second transfer module maintains an intimate engagement with the second housing shell. Accordingly, the assembly clip may generate a biasing force against at least one of the first or second transfer modules.

Figure 5:
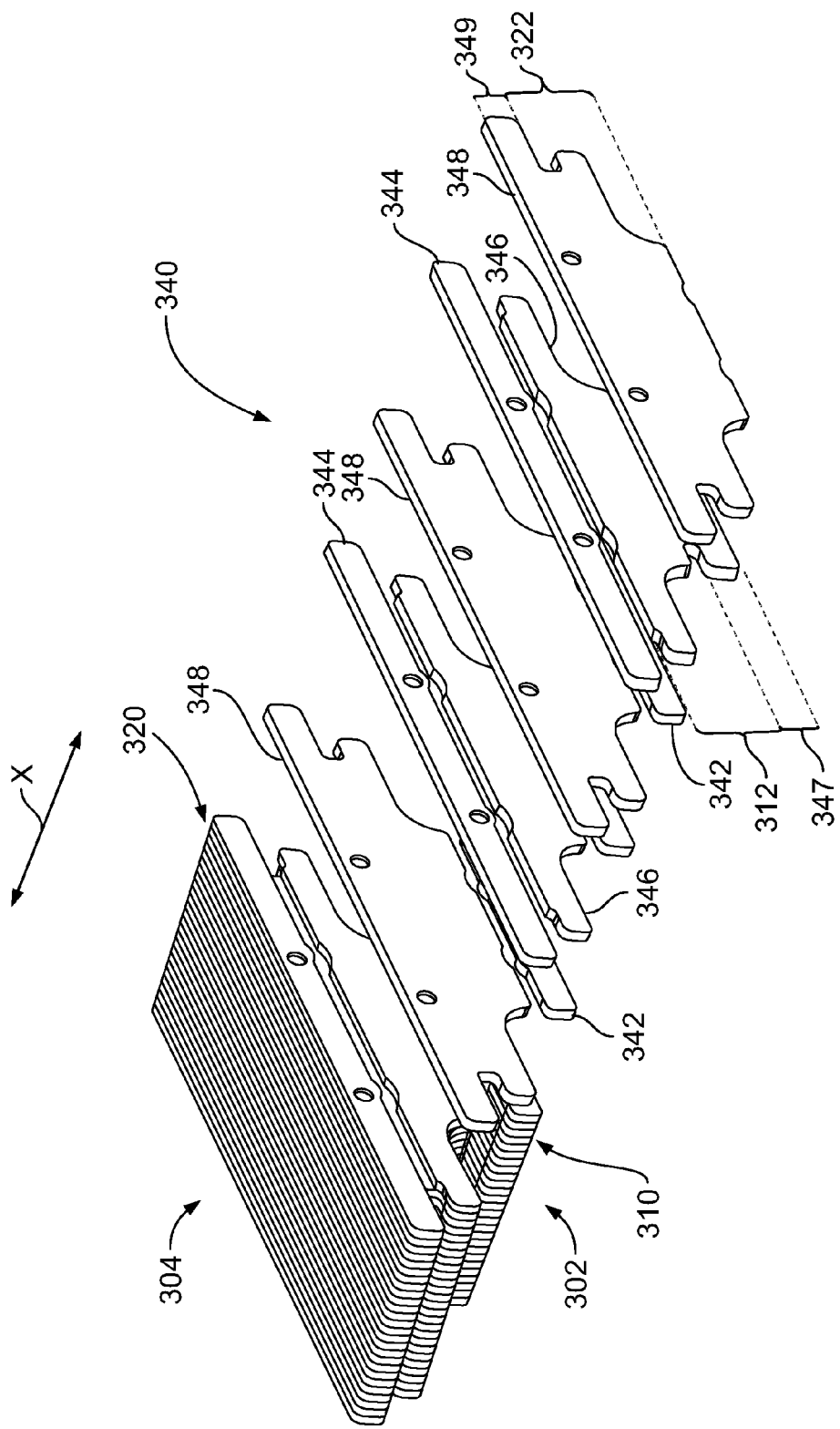
FIG. 5 illustrates how, in one embodiment, various sheet sections may be stacked with respect to one another to form the first and second thermal-transfer modules.

FIG. 5 provides a high-level illustration of how the first and second transfer modules 302, 304 may be manufactured in accordance with some embodiments. Steps and features of one such manufacturing process are described in greater detail below with respect to FIGS. 8-12.

FIG. 5 is a partially exploded view of the first and second transfer modules 302, 304 and illustrates how discrete sheet sections 340 may be stacked side-by-side along the X-axis. In an exemplary embodiment, the first and second transfer modules 302, 304 are assembled concurrently during the same manufacturing process. After the manufacturing process, the first and second transfer modules 302, 304 are in the mated arrangement. In other embodiments, however, the first and second transfer modules 302, 304 may be separately manufactured using different manufacturing processes. In such cases, the separate first and second transfer modules 302, 304 may subsequently be merged into the mated arrangement. Although the first and second transfer modules 302, 304 may be assembled through stacking processes in some embodiments, it is contemplated that first and second transfer modules may be manufactured using other processes, such as a molding process or a three-dimensional (3D) printing process. In such embodiments, the first and second transfer modules may not include discrete sheet sections, but may include other features described herein (e.g., body base, projections, gaps, and the assembly clip).

In the illustrated embodiment, the sheet sections 340 include spacer sections 342, 344 and transfer sections 346, 348. The sheet sections 304 may have an essentially common thickness. Alternatively, the sheet sections 304 may have different thicknesses. By way of example, the thickness may be at most 1.00 mm, at most 0.50 mm, or at most 0.25 mm. In some embodiments, the thickness may be at most 0.20 mm or at most 0.15 mm. In particular embodiments, the thickness is at most 0.10 mm or at most 0.05 mm. In more particular embodiments, the thickness is essentially equal to 0.03 mm.

The spacer sections 342 and the transfer sections 346 are configured to be stacked along the X-axis such that the spacer and transfer sections 342, 346 are interleaved with one another. Collectively, the spacer sections 342 and the transfer sections 346 define the first transfer module 302. The spacer sections 344 and the transfer sections 348 are configured to be stacked along the X-axis such that the spacer and transfer sections 344, 348 are interleaved with one another. Collectively, the spacer sections 344 and the transfer sections 348 define the second transfer module 304.

The projections 312 of the first transfer module 302 are portions (or sub-sections) of the transfer sections 346. The transfer sections 346 are sized and shaped relative to the spacer sections 342 to form the projections 312. The spacer sections 342 are positioned between adjacent transfer sections 346 and thereby cause the corresponding gaps 316 (FIG. 3) between adjacent projections 312. As shown, the transfer sections 346 include base portions 347. The spacer sections 342 and the base portions 347 of the transfer sections 346 collectively define the body base 310 of the first transfer module 302.

In a similar manner, the projections 322 of the second transfer module 304 are portions (or sub-sections) of the transfer sections 348. The transfer sections 348 are sized and shaped relative to the spacer sections 344 to form the projections 322. The spacer sections 344 are positioned between adjacent transfer sections 348 and thereby cause the corresponding gaps 326 (FIG. 3) between adjacent projections 322. As shown, the transfer sections 348 include base portions 349. The spacer sections 344 and the base portions 349 of the transfer sections 348 collectively define the body base 320 of the second transfer module 304.

Figure 6:
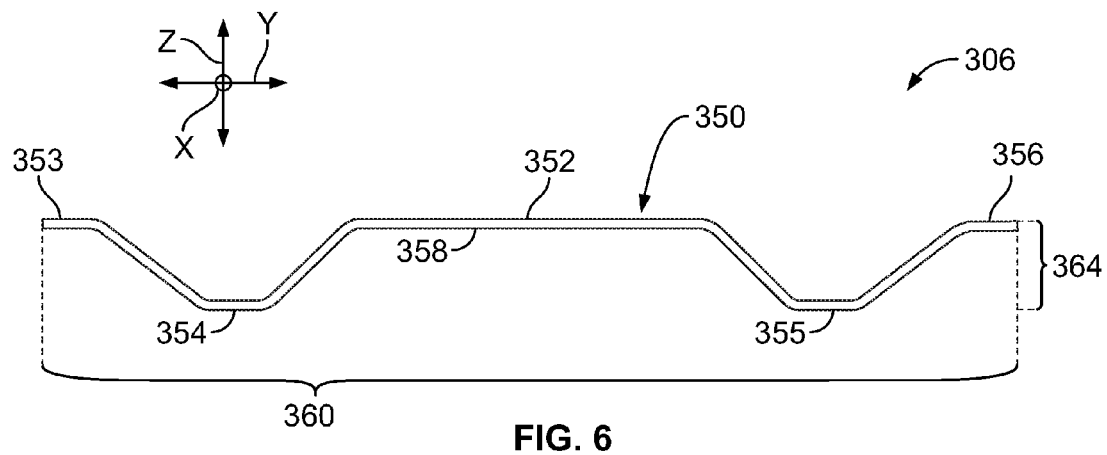
FIG. 6 is an isolated side view of an assembly clip of the thermal-transfer assembly of FIG. 3.
Figure 7:
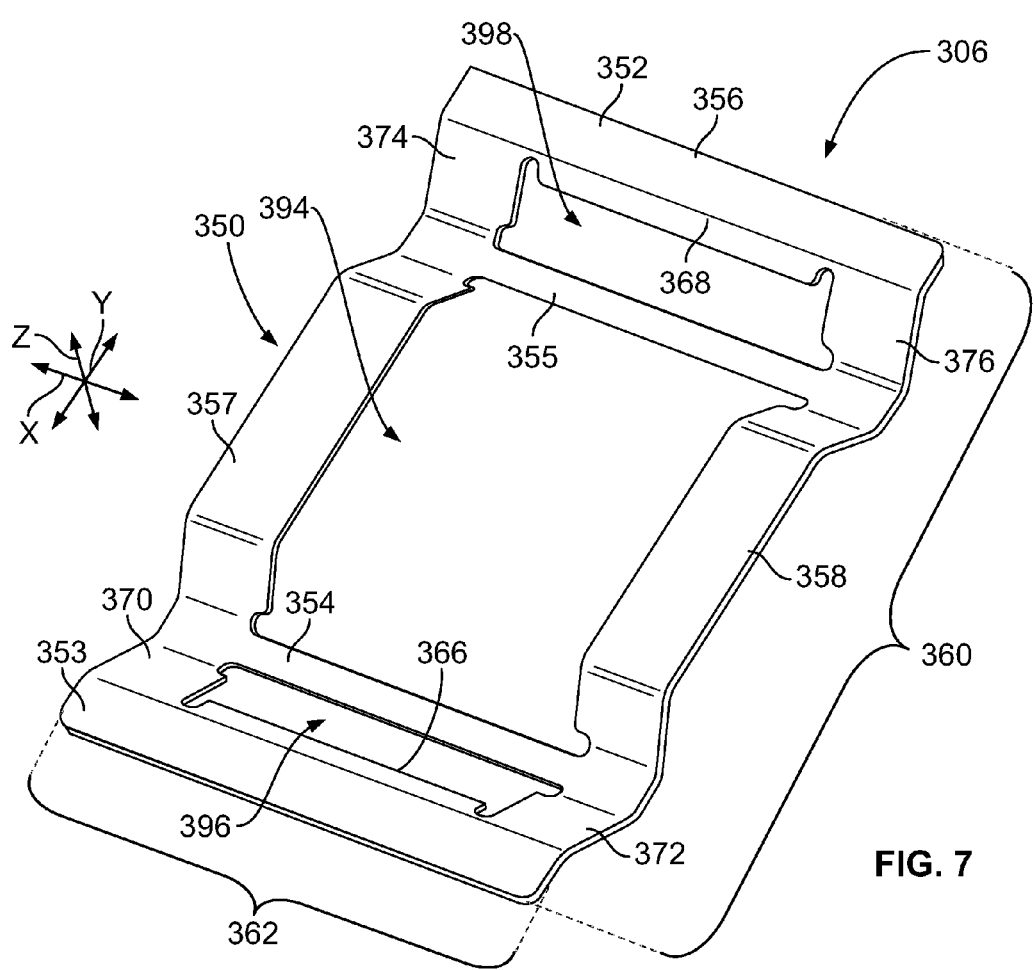
FIG. 7 is an isolated perspective view of the assembly clip of the thermal-transfer assembly of FIG. 3.

FIG. 6 is an isolated side view of the assembly clip 306, and FIG. 7 is an isolated perspective view of the assembly clip 306. In the illustrated embodiment, the assembly clip 306 includes a frame 350 having interconnected clip links 352. The clip links 352 define a central opening 394 and side openings 396, 398. In some embodiments, the frame 350 is stamped and formed from a sheet of material (e.g., sheet metal). In other embodiments, however, the frame 350 may be manufactured through other processes (e.g., molding or 3D-printing). The frame 350 has a length 360 measured along the Y-axis, a width 362 (FIG. 7) measured along the X-axis, and a height 364 (FIG. 6) measured along the Z-axis. Although the following describes one example of how the assembly clip 306 may be configured, it should be understood that the assembly clip 306 may have other configurations. The selected configuration may be based, at least in part, on the shape of the first and second transfer modules 302, 304.

The clip links 352 include lateral links 353, 354, 355, 356 and longitudinal links 357 (FIG. 7) and 358. Each of the lateral links 353-356 extends generally along the X-axis. The lateral links 353-356 may extend for essentially the entire width 362 of the frame 350. Each of the longitudinal links 357, 358 extends generally along the Y-axis. The longitudinal links 357, 358 may extend for the entire length 360 of the frame 350. In the illustrated embodiment, each of the longitudinal links 357, 358 has a 3D shape and each of the lateral links 353-356 has a two-dimensional (2D) shape.

As shown, the lengths of the lateral links 353-356 appear shorter than the lengths of the longitudinal links 357, 358. In other embodiments, however, the lengths of the lateral links 353-356 may be longer than the lengths of the longitudinal links 357, 358. Moreover, although the lengths of the lateral links 353-356 appear essentially equal to one another and the lengths of the longitudinal links 357, 358 appear essentially equal, the lengths may vary in other embodiments. For example, the lateral link 353 may be longer than the lateral link 356.

As shown in FIG. 7, the assembly clip 306 may also include biasing springs 366, 368. In the illustrated embodiment, the biasing springs 366, 368 are coupled to the lateral links 353, 356, respectively, and are tabs that extend lengthwise along the X-axis. The biasing spring 366 is aligned with joint segments 370, 372 of the longitudinal links 357, 358, respectively, that extend between the lateral links 353 and 354. The biasing spring 368 is aligned with joint segments 374, 376 of the longitudinal links 357, 358, respectively, that extend between the lateral links 355 and 356. The biasing springs 366, 368 are non-orthogonal with respect to the XY plane or the XZ plane.

Figure 8:
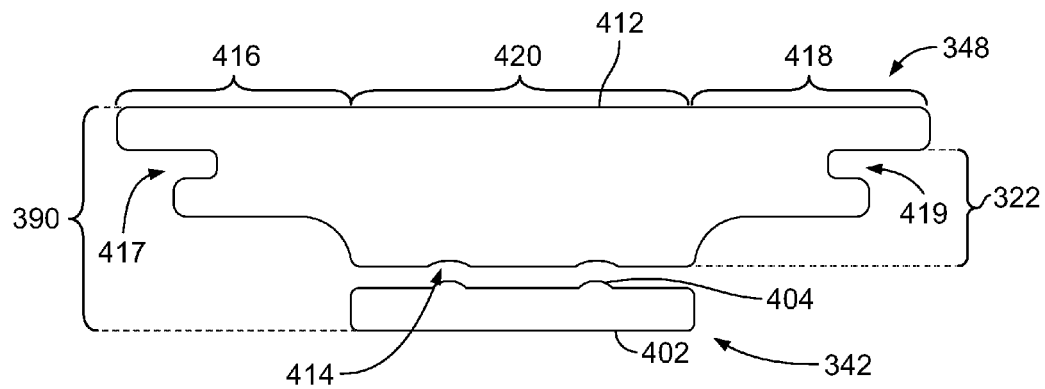
FIG. 8 is a plan view of one assembly layer of the thermal-transfer assembly of FIG. 3.
Figure 9:
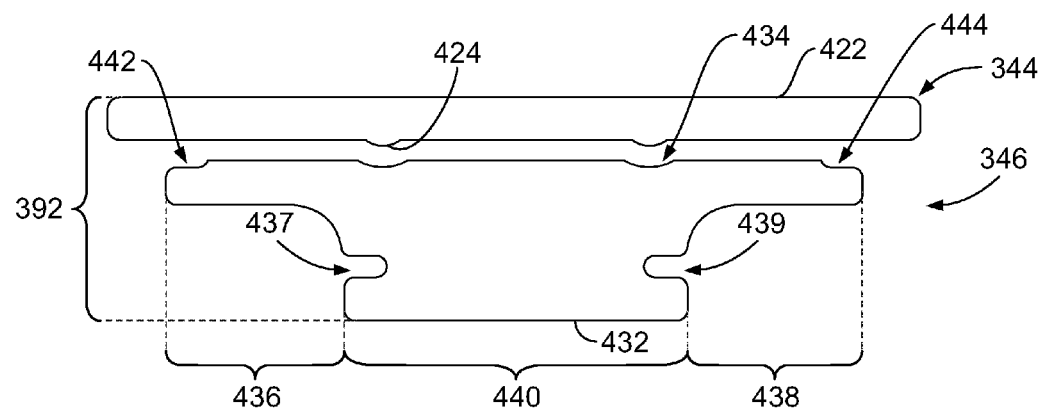
FIG. 9 is a plan view of an adjacent assembly layer of the thermal-transfer assembly of FIG. 3.

FIGS. 8-12 illustrate different steps and features of an exemplary manufacturing process for constructing the thermal-transfer assembly 300. FIG. 8 is a plan view of the spacer section 342 and the transfer section 348, which constitute an assembly layer 390. FIG. 9 is a plan view of the spacer section 344 and the transfer section 346, which constitute an assembly layer 392. In some embodiments, the spacer and transfer sections 342 and 348 (or the assembly layer 390) may be stamped from a common sheet of material (or blank), and the spacer and transfer sections 344 and 346 (or the assembly layer 392) may be stamped from a common sheet of material (or blank). The sheets of material may comprise, for example, pure copper or another material that is sufficiently thermally-conductive.

Unless claimed otherwise, a material is "sufficiently thermally-conductive" (or similar phrase) if the material has a thermal conductivity that is at least 50 W/m K. In particular embodiments, the material is sufficiently thermally-conductive if the thermal conductivity is at least 100 W/m K, at least 200 W/m K or, more particularly, at least 300 W/m K. One or more appropriate ASTM standards for testing thermal conductivity may be used to determine whether a material is sufficiently thermally-conductive. If any of the appropriate ASTM standards is satisfied, then the material is sufficiently thermally-conductive. For embodiments that include stacked sheet sections, the material during testing has a thickness that is equal to the thickness of the corresponding sheet section.

In some embodiments, the sheet of material during the stamping process may have a uniform thickness. In other embodiments, the sheet of material may be shaped such that the thickness changes along the corresponding sheet section. By stamping the assembly layer 390 (FIG. 8) from a common sheet of material, the gaps 316 (FIG. 3) may be able to accommodate the projections 322 (FIG. 3) with relatively small tolerance spaces between the projections 322 and the projections 312. By stamping the assembly layer 392 (FIG. 9) from a common sheet of material, the gaps 326 (FIG. 3) may be able to accommodate the projections 312 (FIG. 3) with relatively small tolerance spaces between the projections 312 and the projections 322.

As shown in FIG. 8, the spacer section 342 has a section edge 402, and the transfer section 348 has a section edge 412. The section edge 402 defines a profile or shape of the spacer section 342. As shown, the spacer section 342 is substantially rectangular and has enlarged areas 404 in the illustrated embodiment.

The section edge 412 defines a profile or shape of the transfer section 348. As shown, the transfer section 348 includes recesses 414 that are sized and shaped to at least partially receive the enlarged areas 404. The transfer section 348 also includes opposite section wings 416, 418 and a center portion 420 that extends between the section wings 416, 418. The section wings 416, 418 have respective open-ended slots 417, 419. The open-ended slots 417, 419 are at least partially defined by the projection 322 that is defined by the transfer section 348.

As shown in FIG. 9, the spacer section 344 has a section edge 422, and the transfer section 346 has a section edge 432. The section edge 422 defines a profile or shape of the spacer section 344. As shown, the spacer section 344 is substantially rectangular and has enlarged areas 424. The enlarged areas 404 and 424 may provide additional material for receiving a stake during a deformation process described below. The additional material may reduce a likelihood that the corresponding spacer sections are damaged to the extent that the spacer sections are not usable for forming the corresponding transfer module.

The section edge 432 defines a profile or shape of the transfer section 346. As shown, the transfer section 346 includes recesses 434 that are sized and shaped to at least partially receive the enlarged areas 424. The transfer section 346 also includes opposite section wings 436, 438 and a center portion 440 that extends between the section wings 436, 438. The center portion 440 has opposite open-ended slots 437, 439. Also shown, the section wings 436, 438 include distal recesses or notches 442, 444, respectively.

Figure 10:
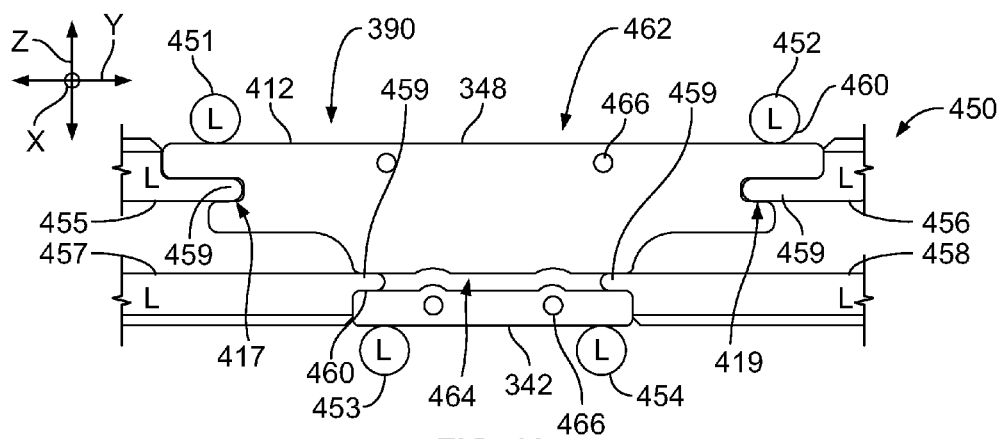
FIG. 10 shows two sheet sections being positioned for a stacking operation.

FIG. 10 illustrates a positioning assembly 450 that may be used during a stacking or laminating process for constructing the first and second transfer modules 302, 304 (FIG. 1). The positioning assembly 450 includes a plurality of reference surfaces that hold the sheet sections in fixed positions as the sheet sections are joined. In the illustrated embodiment, the positioning assembly 450 includes section locators 451-458. The section locators 451-454 are posts that extend out of the page in FIG. 10 along the X-axis. The section locators 455-458 are contoured walls that also extend out of the page along the X-axis. The section locators 455-458 include extensions 459 that project along the YZ plane. Each of the section locators 451-458 has a reference surface 460 that faces and engages at least one sheet section of the assembly layer. As a group, the reference surfaces 460 of the section locators 451-458 define a stacking volume 462 that is configured to receive the sheet sections as the first and second transfer modules 302, 304 are constructed. The stacking volume is a 3D volume having a height measured along the X-axis in FIG. 10.

As shown in FIG. 10, the transfer section 348 and the spacer section 342 of the assembly layer 390 are positioned within the stacking volume 462. The section locators 451 and 452 engage the section edge 412 of the transfer section 348. The extensions 459 of the section locators 455, 456 are received within the open-ended slots 417, 419, respectively. The extensions 459 of the section locators 457, 458 are engaged to the section edge 412 of the transfer section 348. As such, the section locators 451, 452, 455, 456, 457, and 458 engage the transfer section 348 and, as a group, hold the transfer section 348 in a fixed position.

The spacer section 342 is held in a fixed position relative to the transfer section 348 by the section locators 453, 454 and the extensions 459 of the section locators 457, 458. Accordingly, the extensions 459 of the section locators 457, 458 engage the spacer section 342 and the transfer section 348 and define a layer gap 464 therebetween.

Optionally, holes (indicated at 466) may be formed through the transfer section 348 and the spacer section 342 during a first step of the stacking process. Alternatively, the holes 466 may be formed prior to the transfer section 348 and the spacer section 342 being disposed within the stacking volume 462.

Figure 11:
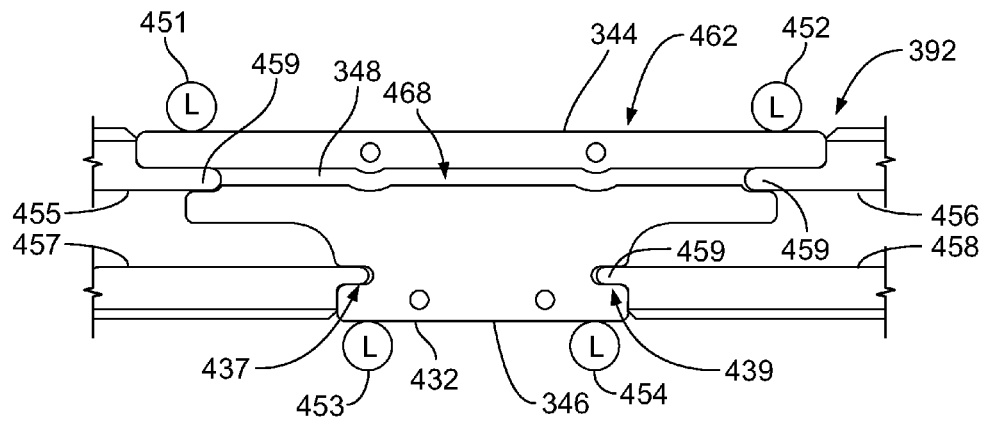
FIG. 11 shows two sheet sections that are stacked onto the sheet sections of FIG. 10.

As shown in FIG. 11, the transfer section 346 and the spacer section 344 of the assembly layer 392 are positioned within the stacking volume 462. The positioning assembly 450 is configured to permit the transfer section 346 to be stacked onto the spacer section 342 (FIG. 10) and the transfer section 348 (FIG. 10) and to permit the spacer section 344 to be stacked onto the transfer section 348. More specifically, the assembly layer 392 is positioned over the assembly layer 390 (FIG. 10). The section locators 453 and 454 engage the section edge 432 of the transfer section 346. The extensions 459 of the section locators 457, 458 are received within the open-ended slots 437, 439, respectively. The extensions 459 of the section locators 455, 456 are engaged to the section edge 432 of the transfer section 346. As such, the section locators 453-458 engage the transfer section 346 and, as a group, hold the transfer section 346 in a fixed position.

The spacer section 344 is held in a fixed position relative to the transfer section 346 by the section locators 451, 452 and the extensions 459 of the section locators 455, 456. The extensions 459 of the section locators 455, 456 engage the spacer section 344 and the transfer section 346 and define a layer gap 468 therebetween. A portion of the transfer section 348 below the assembly layer 392 is shown through the gap 468.

Figure 12:
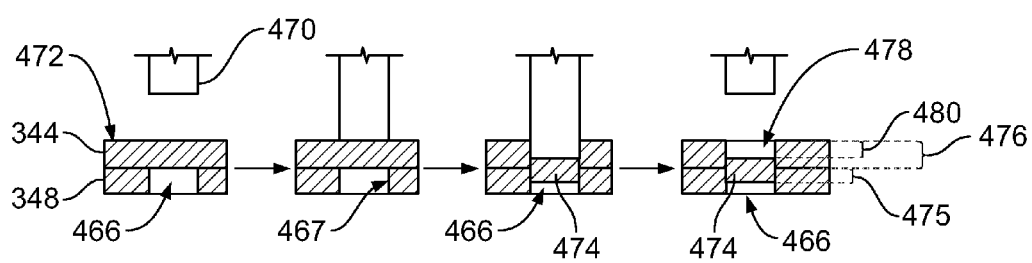
FIG. 12 illustrates a deformation process that may be used to secure the different sheet sections to one another.

FIG. 12 illustrates a deformation process that may be used to secure adjacent sheet sections to one another. For example, the transfer section 348 and the spacer section 344 may be secured to each other through the deformation process. Similarly, the transfer section 346 (FIG. 11) and the spacer section 342 (FIG. 10) may be secured to each other through a deformation process. In some embodiments, the deformation process may be characterized as a micro-staking process in which a stake 470 is driven into the corresponding sheet section.

FIG. 12 shows four different stages of an exemplary deformation process in which a single stake 470 is driven or punched into the spacer section 344. Although the following describes one stroke of a single stake 470, it should be understood that multiple stakes 470 may be used simultaneously to secure the sheet sections to one another.

As shown, the stake 470 engages a side surface 472 of the spacer section 344. The stake 470 engages a portion of the spacer section 344 that is positioned over the hole 466 through the transfer section 348. The hole 466 permits the stake 470 to deform the spacer section 344 and punch a portion of the spacer section 344 (referred to as a slug 474) into the hole 466. The slug 474 frictionally engages an inner edge 467 of the transfer section 348 that defines the hole 466 while remaining attached to the non-deformed portion of the spacer section 344.

The spacer section 344 has a thickness 476. As shown, the slug 474 may extend a depth 475 into the hole 466 of the transfer section 348 that is about equal to half the thickness 476 of the spacer section 344. After the deformation process, a slug recess 478 is formed within the spacer section 344 that has a depth 480 that is about equal to half the thickness 476. The slug recess 478 is configured to receive a corresponding slug (not shown) of an adjacent transfer section (not shown) that is stacked onto the spacer section 344. By repeatedly stacking and deforming the sheet sections, the first and second transfer modules 302, 304 (FIG. 3) may be simultaneously formed in a merged arrangement. Collectively, the slugs 474 may hold the sheet sections of the corresponding transfer module in fixed positions with respect to one another such that the sheet sections form a unitary structure.

Figure 14:
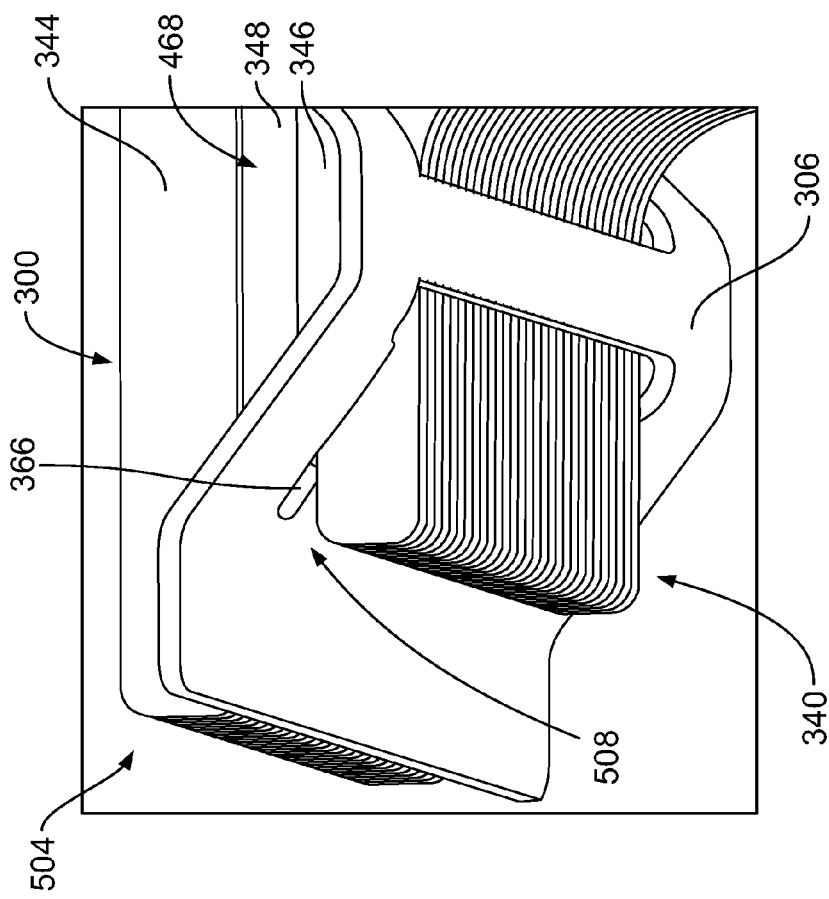
FIG. 14 is an enlarged view of another portion of the thermal-transfer assembly illustrating a biasing spring in greater detail.
Figure 13:
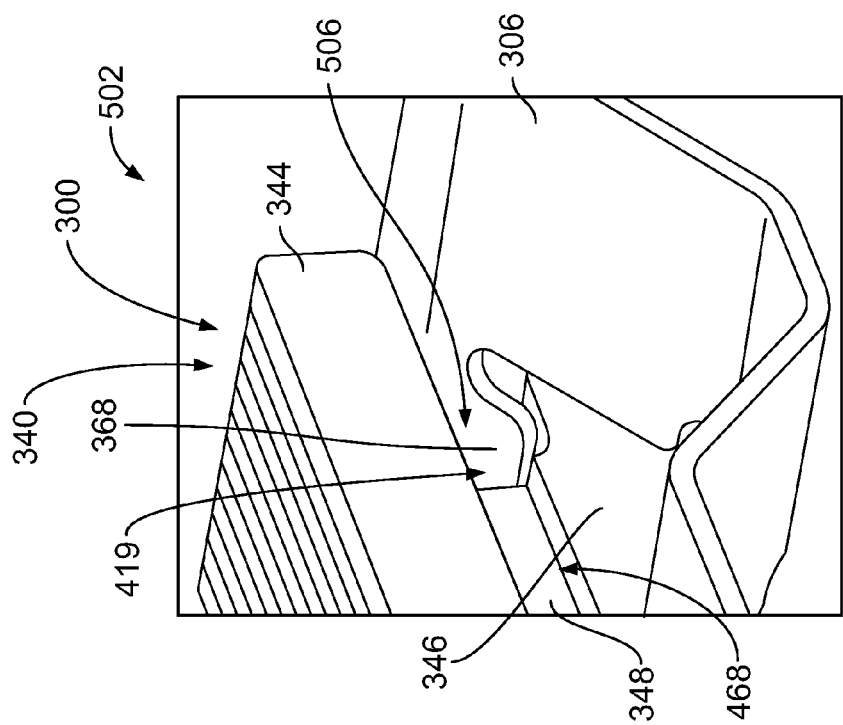
FIG. 13 is an enlarged view of a portion of the thermal-transfer assembly illustrating a biasing spring in greater detail.

FIGS. 13 and 14 are enlarged views of opposite ends 502, 504, respectively, of the thermal-transfer assembly 300. For illustration, one of the transfer sections 348 has been removed such that the adjacent spacer section 344 and the associated transfer section 346 are exposed. Another transfer section 348 is exposed through the layer gap 468. The ends 502, 504 include module slots 506, 508, respectively, that are sized and shaped to receive the biasing springs 368, 366, respectively. The module slot 506 is formed when the open-ended slots 419 of the transfer sections 348 are aligned with one another and the layer gaps 468. The module slot 508 is formed when the open-ended slots 417 (FIG. 8) of the transfer sections 348 are aligned with one another and the layer gaps 468. After the sheet sections 340 are stacked side-by-side, the assembly clip 306 may be coupled to the first and second transfer modules 302, 304 (shown in FIGS. 3 and 4) by inserting the biasing springs 366, 368 in to the respective module slots 508, 506.

During operation, the transfer sections 346 that partially define corresponding layer gaps 468 are permitted to move relative to the corresponding spacer sections 344. When the transfer sections 346 are moved, the dimensions of the layer gaps 468 change. The biasing springs 366, 368 are configured to engage the transfer sections 346 when the transfer sections 346 move toward the spacer sections 344.

By using a manufacturing process, such as the manufacturing process described with respect to FIGS. 10-12, the transfer modules 302, 304 can have respective projections 312, 322 that are interleaved with one another and have an effectively zero clearance or gap therebetween. The projections 312 are formed by the transfer sections 346, and the projections 322 are formed by the transfer sections 348. More specifically, as described above, the projections 312 of the first transfer module 302 have gaps 316 therebetween, and the projections 322 of the second transfer module 304 have gaps 326 therebetween. When the transfer modules 302, 304 are simultaneously constructed, the projections 312 are disposed within respective gaps 326 and the projections 322 are disposed within the gaps 316. When the sheet sections are stamped from sheet material having a common thickness and then stacked and staked together as described above, the interface between each projection 312 and the adjacent projection 322 may have a tolerance space with an effectively zero clearance (e.g., less than 0.005 mm). More specifically, the gaps 326 are essentially equal to the thicknesses of the projections 312, and the gaps 316 are essentially equal to the thicknesses of the projections 322. The projections 312, 322 may be configured such that the area in which they overlap or interface may be sufficient for transferring thermal energy therebetween, regardless of the expansion distance.

Figure 15:
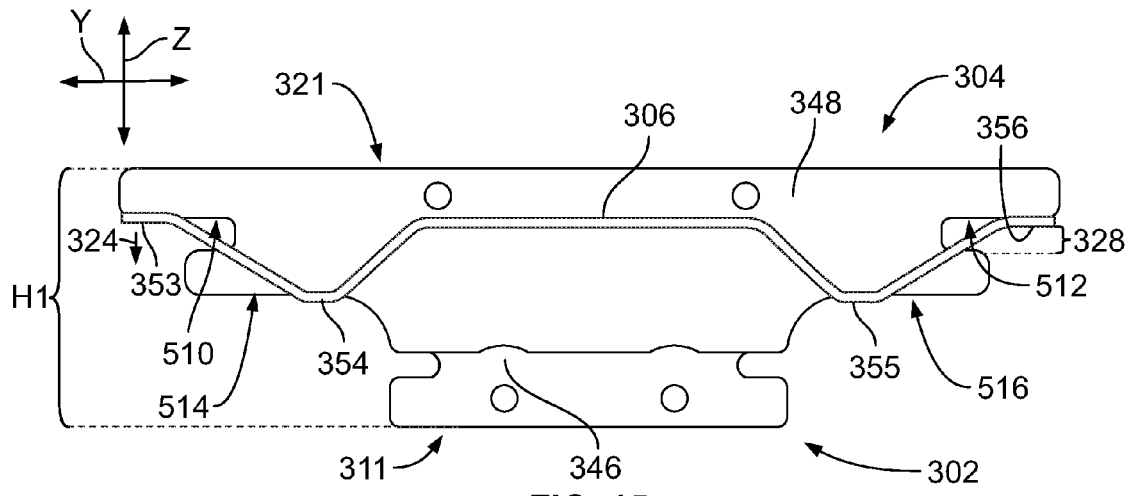
FIG. 15 is a side view of the thermal-transfer assembly when the first and second thermal-transfer modules are in a mated arrangement at a maximum expansion distance.
Figure 16:
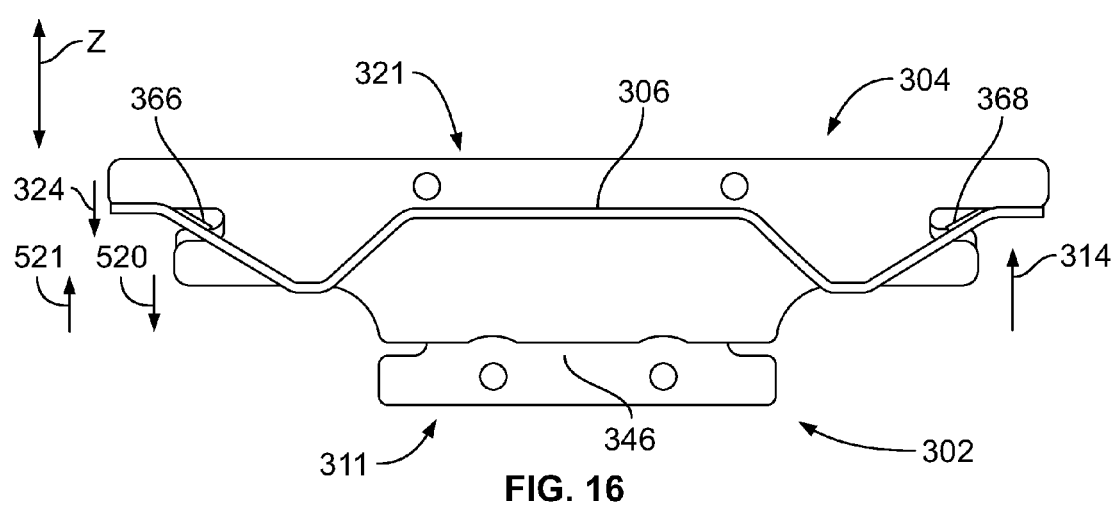
FIG. 16 is a side view of the thermal-transfer assembly when the biasing springs are partially compressed or defected.
Figure 17:
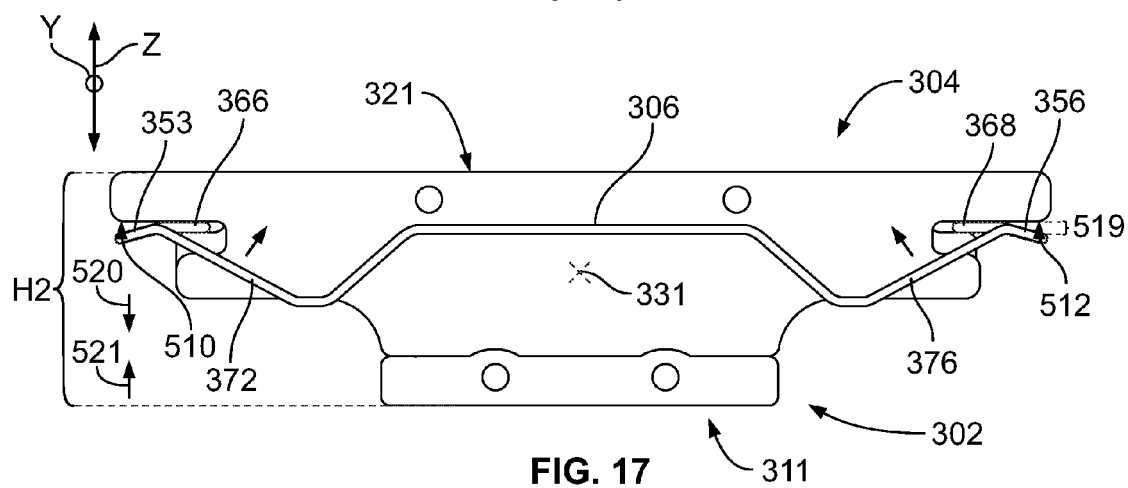
FIG. 17 is a side view of the thermal-transfer assembly when the first and second thermal-transfer modules are at a minimum expansion and the biasing springs are fully compressed.

FIGS. 15-17 illustrate how the assembly clip 306 may operate in controlling movement of the first and second modules 302, 304. In some embodiments, the assembly clip 306 is coupled (e.g., directly or indirectly) to each of the first and second transfer modules 302, 304. In some embodiments, an entire weight of the assembly clip 306 may be supported by the first transfer module 302 and/or the second transfer module 304 as shown in FIGS. 15-17. The assembly clip 306 is positioned between the engagement sides 311, 321 such that the assembly clip 306 does not extend beyond either of the engagement sides 311, 321.

During operation, the assembly clip 306 may engage each of the first and second transfer modules 302, 304. Based on the shape or configuration of the first and second transfer modules 302, 304, the assembly clip 306 may engage them simultaneously or at separate times. For example, the assembly clip 306 may directly engage the second transfer module 304 throughout operation but may directly engage the first transfer module 302 only at certain times and not directly engage the first transfer module 302 at other times. In the illustrated embodiment, however, the assembly clip 306 engages each of the first and second transfer modules 302, 304 throughout operation.

The first and second transfer modules 302, 304 are in the mated arrangement in FIGS. 15-17. In FIG. 15, the first and second transfer modules 302, 304 are at the maximum expansion distance 328. The thermal-transfer assembly 300 (FIG. 4) may have the maximum height H1 when the first and second transfer modules 302, 304 are at the maximum expansion distance 328. The biasing springs 366, 368 (FIGS. 16 and 17) are not compressed or deflected when the first and second transfer modules 302, 304 are at the maximum expansion distance 328, but may be partially compressed or deflected in other embodiments. In FIG. 16, the first and second transfer modules 302, 304 are closer to one another such that the expansion distance is less than the maximum expansion distance 328 (FIG. 15). The biasing springs 366, 368 are partially compressed or deflected in FIG. 16. In FIG. 17, the thermal-transfer assembly 300 is at the minimum height H2, and the expansion distance is at a minimum. The biasing springs 366, 368 are compressed or deflected to the greatest extent possible in the illustrated embodiment.

With specific reference to FIG. 15, the engagement side 311 of the first transfer module 302 is defined by respective outer edge portions of the transfer sections 346 and the spacer sections 342 (FIG. 8). The engagement side 321 of the second transfer module 304 is defined by respective outer edge portions of the transfer sections 348 and the spacer sections 344 (FIG. 9). The engagement sides 311, 321 represent the portions of the first and second transfer modules 302, 304 that engage objects for transferring thermal energy from one object to another object. Depending upon the application, either of the engagement sides 311, 321 may intimately engage a heat source while the other engagement side intimately engages another object, such as a device housing. In alternative embodiments, a portion of the other engagement side may be exposed to an exterior of the device such that the thermal energy dissipates into the space surrounding the device.

Accordingly, a thermal-transfer path may extend from the engagement side 311 to the engagement side 321 or, alternatively, the thermal-transfer path may extend from the engagement side 321 to the engagement side 311. In an exemplary embodiment, the engagement side 311 intimately engages the heat source and the engagement side 321 intimately engages another object, such as a device housing that defines an exterior of the device. The engagement side 321 may have a larger area than an area of the engagement side 311 so that thermal energy may dissipate more quickly.

The second transfer module 304 also defines slot sides 510, 512 and wing sides 514, 516. In the illustrated embodiment, the slot sides 510, 512 and the wing sides 514, 516 face in the second direction 324. The slot sides 510, 512 are collectively defined by the stacked transfer and spacer sections 348, 344, respectively, which form the second transfer module 304. The wing sides 514, 516 of the second transfer module 304 are collectively defined by the stacked transfer sections 348 that are separated by the corresponding gaps 316 (FIG. 3).

When the first and second transfer modules 302, 304 are at the maximum expansion distance 328, the transfer sections 346 engage the lateral links 354, 355 of the assembly clip 306. The lateral links 354, 355 operate as positive stops or "catches" that prevent the first transfer module 302 from moving away from the second transfer module 304 beyond a predetermined point. Likewise, the biasing springs 366, 368 (shown in FIGS. 16 and 17) may engage the transfer sections 348 of the second transfer module 304 thereby preventing the second transfer module 304 from moving away from the first transfer module 302 beyond a predetermined point. Accordingly, the assembly clip 306 prevents the first and second transfer modules 302, 304 from separating from each other along the Z-axis.

In some embodiments, the assembly clip 306 is configured to permit the first and second transfer modules 302, 304 to move relative to each other along the Y-axis. For example, the lateral links 353-356 may be sized, shaped, and positioned relative to one another to permit the first and second transfer modules 302, 304 to move relative to each other along the Y-axis. In particular embodiments, however, the assembly clip 306 may prevent the first and second transfer modules 302, 304 from separating from each other. More specifically, the lateral links 353-356 may prevent the transfer sections 346, 348 from sliding along the Y-axis beyond predetermined points.

Turning to FIG. 16, as the first and second transfer modules 302, 304 move toward each other, the first transfer module 302 deflects the biasing springs 366, 368 in the first direction 314. In the illustrated embodiment, the transfer sections 346 deflect the biasing springs 366, 368 in the first direction 314. As the biasing springs 366, 368 are deflected, the biasing springs 366, 368 generate a biasing force 520 such that the biasing springs 366, 368 impede or resist movement of the first transfer module 302 in the first direction 314. In other words, the biasing force 520 is directed in the second direction 324 along the Z-axis. Alternatively, as the biasing springs 366, 368 are deflected, the biasing springs 366, 368 generate a biasing force 521 such that the biasing springs 366, 368 impede or resist movement of the second transfer module 304 in the second direction 324.

As shown in FIG. 17, the first and second transfer modules 302, 304 are at a minimum expansion distance 519 when the biasing springs 366, 368 are fully compressed. In some embodiments, the minimum expansion distance 519 may be equal to a thickness of the biasing springs 366, 368. The biasing force 520 (or the biasing force 521) may be greatest when the first and second transfer modules 302, 304 are at the minimum expansion distance 519. Also shown, the lateral links 353 and 356 may be bent or rotated away from the slot sides 510, 512, respectively, due to a rotational force that is generated when the biasing springs 366, 368 are deflected. In some embodiments, the joint segments 372, 376 may also bend or buckle as indicated by the arrows.

Accordingly, when the biasing springs 366, 368 are at least partially compressed or deflected, the assembly clip 306 biases the first and second transfer modules 302, 304 away from each other along the Z-axis. As described above, the assembly clip 306 also prevents the first and second transfer modules 302, 304 from separating along the Z-axis. It should be understood that these two functions of the assembly clip 306 may occur at the same time or at separate times. For example, the assembly clip 306 may prevent the first and second transfer modules 302, 304 from separating at a first point in time and bias the first and second transfer modules 302, 304 away from each other at a second point in time.

In some embodiments, the assembly clip 306 may also permit at least one of the first and second transfer modules 302, 304 to partially rotate about the axis 331 that extends parallel to the X-axis. As such, in some embodiments, the assembly clip 306 permits the first and second transfer modules 302, 304 to move along the Z-axis, the Y-axis, and rotate about an axis that is parallel to the X-axis, thereby allowing the engagement sides 311, 321 to move relative to each other in multiple directions while a respective force presses the engagement sides 311, 321 against respective surfaces.

For example, if the first and second transfer modules 302, 304 are positioned between two objects (not shown) of a device (not shown), the biasing springs 366, 368 may maintain the first and second transfer modules 302, 304 in intimate engagements with both objects when the biasing springs 366, 368 are at least partially compressed or deflected. More specifically, the biasing force 520 may effectively press the engagement side 311 of the first transfer module 302 against a surface of one of the objects. If the object does not move, the biasing force 520 effectively causes an opposite reactive biasing force 521 that presses the engagement side 321 of the second transfer module 304 against a surface of the other object. As such, an intimate engagement between the engagement side 311 and one object is formed and an intimate engagement between the engagement side 321 and the other object is formed. Moreover, these intimate engagements may be maintained throughout the lifetime of the device. For example, if the objects or other structural components of the device bend or creep relative to one another during the lifetime of the device, the assembly clip 306 permits the first and second transfer modules 302, 304 to move relative to one another in order to maintain the intimate engagements.

In other embodiments, an assembly clip may only provide one of the above functions. More specifically, the assembly clip may prevent the first and second transfer modules from separating along the Z-axis, or may bias the first and second transfer modules away from each other along the Z-axis. If the assembly clip only prevents separation, the assembly clip may be devoid of biasing springs and, instead, only have lateral links that prevent the first and second transfer modules from moving beyond a maximum expansion distance. If the assembly clip only biases the first and second transfer modules away from each other along the Z-axis, the assembly clip may be devoid of lateral links that prevent separation of the first and second transfer modules. In this alternative embodiment, the first and second transfer modules may be disposed between two objects that prevent the first and second transfer modules from separating.

Figure 18:
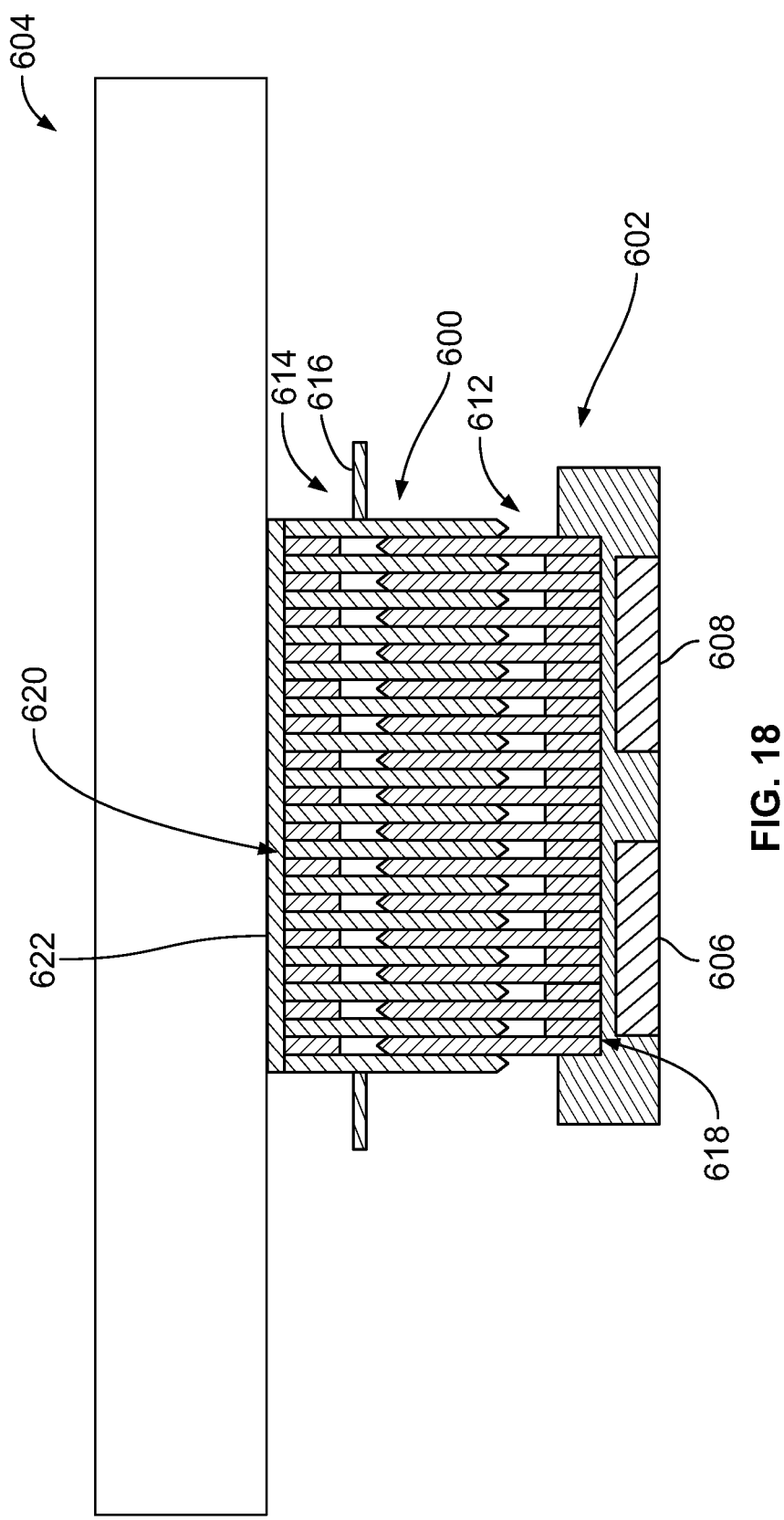
FIG. 18 is a cross-section of a thermal-transfer assembly disposed between two components.

FIG. 18 is a cross-section of a thermal-transfer assembly 600 when positioned between first and second components 602, 604 of a device (not shown). The first component 602 includes two processing units 606, 608 that generate thermal energy during operation. The second component 604 may be a housing of the device.

The thermal-transfer assembly 600 may be similar or identical to the thermal-transfer assembly 300 (FIG. 3). For example, the thermal-transfer assembly 600 includes a first transfer module 612, a second transfer module 614, and an assembly clip 616. The first transfer module 612 has an engagement side 618 that is intimately engaged with the first component 602. The second transfer module 614 has an engagement side 620 that is coupled to the second component 604 through a thermally-conductive substance 622. The substance 622 may be a thermally-conductive putty or thermally-conductive grease. In such embodiments in which a thin layer of a thermally-conductive substance is disposed between the engagement side and the object, the engagement side is intimately engaged with the object for purposes of heat transfer.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A thermal-transfer assembly comprising:
a first transfer module having a plurality of first projections, the first projections being spaced apart from one another to form corresponding gaps therebetween;
a second transfer module having a plurality of second projections, the second projections being spaced apart from one another to form corresponding gaps therebetween, wherein the first and second transfer modules interface with each other in a mated arrangement in which the first projections are positioned in the corresponding gaps formed by the second projections and the second projections are positioned in the corresponding gaps formed by the first projections, the first and second projections projecting in opposite directions along a Z-axis and intimately engaging one another to transfer thermal energy therebetween; and
an assembly clip coupled to and configured to engage each of the first and second transfer modules, the assembly clip at least one of preventing the first and second transfer modules from separating along the Z-axis or biasing the first and second transfer modules away from each other along the Z-axis.

2. The thermal-transfer assembly of claim 1, wherein the assembly clip includes a frame having interconnected clip links.

3. The thermal-transfer assembly of claim 1, wherein the assembly clip includes a biasing spring that engages and generates a biasing force against at least one of the first or second transfer modules, the biasing force being directed along the Z-axis.

4. The thermal-transfer assembly of claim 1, wherein the assembly clip is configured to prevent the first and second transfer modules from separating along the Z-axis and bias the first and second transfer modules away from each other along the Z-axis.

5. The thermal-transfer assembly of claim 1, wherein the assembly clip permits the first and second transfer modules to move relative to one another.

6. The thermal-transfer assembly of claim 1, wherein the thermal-transfer assembly is oriented with respect to an X-axis and a Y-axis that are perpendicular to each other and to the Z-axis, the assembly clip configured to permit the first transfer module to rotate about the X-axis relative to the second transfer module or shift along the Y-axis relative to the second transfer module.

7. The thermal-transfer assembly of claim 1, wherein the first and second projections of the first and second transfer modules, respectively, form tolerance spaces therebetween, the tolerance spaces being less than 0.200 millimeters.

8. The thermal-transfer assembly of claim 1, wherein the first transfer module comprises:
a plurality of sheet sections stacked side-by-side to form a body base and the first projections extending away from the body base;
wherein the sheet sections include spacer sections and transfer sections, the spacer sections and transfer sections being interleaved with one another, the transfer sections being sized and shaped relative to the spacer sections to form the first projections, the spacer sections being positioned between adjacent transfer sections to define the corresponding gaps between adjacent first projections.

9. An electrical connector comprising:
a connector housing having an interior cavity defined by an inner surface of the connector housing, the connector housing defining an exterior of the electrical connector;
internal electronics disposed within the interior cavity, the internal electronics configured to generate thermal energy during operation; and
a thermal-transfer assembly forming at least a portion of a thermal-transfer path from the internal electronics to the exterior of the electrical connector, the thermal-transfer assembly comprising:
a first transfer module having a plurality of first projections, the first projections being spaced apart from one another to form corresponding gaps therebetween;
a second transfer module having a plurality of second projections, the second projections being spaced apart from one another to form corresponding gaps therebetween, wherein the first and second transfer modules interface with each other in a mated arrangement in which the first projections are positioned in the corresponding gaps formed by the second projections and the second projections are positioned in the corresponding gaps formed by the first projections, the first and second projections projecting in opposite directions along a Z-axis and intimately engaging one another to transfer thermal energy therebetween; and
an assembly clip coupled to each of the first and second transfer modules, the assembly clip biasing the first and second transfer modules away from each other along the Z-axis.

10. The electrical connector of claim 9, wherein the assembly clip includes a frame having interconnected links.

11. The electrical connector of claim 9, wherein the assembly clip includes a biasing spring that engages and generates a biasing force against at least one of the first or second transfer modules, the biasing force being directed along the Z-axis.

12. The electrical connector of claim 9, wherein the thermal-transfer assembly is oriented with respect to an X-axis and a Y-axis that are perpendicular to each other and to the Z-axis, the assembly clip configured to permit the first transfer module to rotate about the X-axis relative to the second transfer module or shift along the Y-axis relative to the second transfer module.

13. The electrical connector of claim 9, wherein the first transfer module has a body base and the first projections extend from the body base, the body base being engaged to the inner surface of the connector housing or to the internal electronics.

14. The electrical connector of claim 9, wherein the electrical connector is a pluggable connector and the internal electronics includes an electro-optical (E/O) engine that transforms data signals between an electrical signal form and an optical signal form.

15. The electrical connector of claim 9, wherein the first transfer module comprises:
a plurality of sheet sections stacked side-by-side to form a body base and the first projections extending away from the body base;
wherein the sheet sections include spacer sections and transfer sections, the spacer sections and transfer sections being interleaved with one another, the transfer sections being sized and shaped relative to the spacer sections to form the first projections, the spacer sections being positioned between adjacent transfer sections to define the corresponding gaps between adjacent first projections.

16. A thermal-transfer module comprising:
a plurality of sheet sections stacked side-by-side to form a body base and a plurality of projections that extend away from the body base and that are spaced apart from one another to form gaps therebetween;
wherein the sheet sections include spacer sections and transfer sections, the spacer sections and transfer sections being interleaved with one another, the transfer sections being sized and shaped relative to the spacer sections to form the projections, the spacer sections being positioned between adjacent transfer sections to define the corresponding gaps between adjacent projections.

17. The thermal-transfer module of claim 16, wherein adjacent sheet sections are staked together such that a slug of one sheet section is received within a recess of the adjacent sheet section.

18. The thermal-transfer module of claim 16, wherein the sheet sections have an essentially common thickness, the common thickness being at most 1.00 mm.

19. The thermal-transfer module of claim 16, wherein the projections are blades.

20. The thermal-transfer module of claim 16, wherein the projections at least partially define open-ended slots that are aligned with one another to form a module slot of the thermal-transfer module.

* * * * *